(12) United States Patent
Yi et al.

(10) Patent No.: US 12,232,376 B2
(45) Date of Patent: Feb. 18, 2025

(54) DISPLAY PANEL WITH REPAIR STRUCTURE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Hong Yi, Beijing (CN); Haigang Qing, Beijing (CN); Tiaomei Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 514 days.

(21) Appl. No.: 17/620,210

(22) PCT Filed: Dec. 23, 2020

(86) PCT No.: PCT/CN2020/138688
§ 371 (c)(1),
(2) Date: Dec. 17, 2021

(87) PCT Pub. No.: WO2022/133822
PCT Pub. Date: Jun. 30, 2022

(65) Prior Publication Data
US 2022/0406871 A1    Dec. 22, 2022

(51) Int. Cl.
*H10K 59/131*    (2023.01)
*G09G 3/00*    (2006.01)
*H10K 59/121*    (2023.01)

(52) U.S. Cl.
CPC ........... *H10K 59/131* (2023.02); *G09G 3/006* (2013.01); *H10K 59/1213* (2023.02); *G09G 2310/0297* (2013.01)

(58) Field of Classification Search
CPC .. H10K 59/131; H10K 59/1213; G09G 3/006; G09G 2310/0297
See application file for complete search history.

(56) References Cited

U.S. PATENT DOCUMENTS

| 8,866,985 B2 | 10/2014 | Zhuang et al. |
| 2006/0187722 A1* | 8/2006 | Han ........................ G09G 3/20 365/200 |

(Continued)

FOREIGN PATENT DOCUMENTS

| CN | 1916700 A | 2/2007 |
| CN | 101441336 A | 5/2009 |

(Continued)

*Primary Examiner* — Stephen G Sherman
(74) *Attorney, Agent, or Firm* — Dilworth & Barrese, LLP.; Michael J. Musella, Esq.

(57) ABSTRACT

A display panel and a display device are provided. The display panel includes: a display region; a peripheral region surrounding the display region; a plurality of pixel units, located in the display region and configured to display an image; a plurality of data lines, electrically connected with the plurality of pixel units and configured to input data signals to the plurality of pixel units; a plurality of data transmission lines, located in the peripheral region and connected with the plurality of data lines; and at least two repair structures, wherein each of the at least two repair structures includes a first repair line and a second repair line, the first repair line is overlapped with the plurality of data transmission lines, and the second repair line is overlapped with the plurality of data lines.

17 Claims, 30 Drawing Sheets

(56) References Cited

U.S. PATENT DOCUMENTS

| | | |
|---|---|---|
| 2007/0040794 A1 | 2/2007 | Kawk et al. |
| 2009/0189850 A1* | 7/2009 | Murayama ............ G09G 3/344 |
| | | 345/107 |
| 2020/0219962 A1* | 7/2020 | Park .................... G09G 3/3258 |

FOREIGN PATENT DOCUMENTS

| | | | | |
|---|---|---|---|---|
| CN | 101592830 A | | 12/2009 | |
| CN | 102169267 A | | 8/2011 | |
| CN | 103676246 A | | 3/2014 | |
| CN | 103745662 A | | 4/2014 | |
| CN | 105511128 A | * | 4/2016 | ........... G02F 1/1309 |
| CN | 106297646 A | | 1/2017 | |
| CN | 108267878 A | | 7/2018 | |
| CN | 208636627 U | * | 3/2019 | |
| CN | 208689337 U | | 4/2019 | |
| CN | 110908200 A | | 3/2020 | |
| JP | 07013197 A | | 1/1995 | |
| KR | 20080100533 A | * | 11/2008 | ........... H10K 59/123 |

\* cited by examiner

DISPLAY PANEL WITH REPAIR STRUCTURE AND DISPLAY DEVICE

TECHNICAL FIELD

At least one embodiment of the present disclosure relates to a display panel and a display device.

BACKGROUND

In recent years, with the improvement of display technology, organic light-emitting diode (OLED) display devices have become one of the hot spots in the research field of flat panel display devices. More and more active matrix organic light-emitting diode (AMOLED) display panels have come into the market. Compared with the traditional thin film transistor liquid crystal display (TFT-LCD), AMOLED has faster reaction speed, higher contrast ratio and wider viewing angle. With the development of display technology, more and more electronic apparatuses begin to use foldable and flexible OLED display screens which are lighter and thinner and also have good impact resistance.

With the gradual development of the market, people have higher requirements on screen size and refresh frequency, so it is necessary to improve the backplane circuit of the display panel and add a repair circuit.

SUMMARY

At least one embodiment of the present disclosure relates to a display panel and a display device.

At least one embodiment of the present disclosure provides a display panel, including: a display region; a peripheral region surrounding the display region; a plurality of pixel units, located in the display region and configured to display an image; a plurality of data lines, electrically connected with the plurality of pixel units and configured to input data signals to the plurality of pixel units; a plurality of data transmission lines, located in the peripheral region and connected with the plurality of data lines; and at least two repair structures, wherein each of the at least two repair structures includes a first repair line and a second repair line, the first repair line is overlapped with the plurality of data transmission lines, and the second repair line is overlapped with the plurality of data lines.

For example, two repair structures of the at least two repair structures are symmetrically arranged, and two first repair lines respectively belonging to the two repair structures are disconnected at a symmetry axis.

For example, two second repair lines respectively belonging to the two repair structures are disconnected at the symmetry axis.

For example, the second repair line is located in the peripheral region and located at one side of the display region away from the first repair line.

For example, in a same repair structure, the first repair line and the second repair line are located at opposite sides of the display region, respectively.

For example, the repair structure further includes a plurality of first data multiplexers and a second data multiplexer, the second repair line includes a plurality of second repair lines, and the plurality of data transmission lines are connected with the plurality of data lines through the plurality of first data multiplexers; the first repair line is connected with the plurality of second repair lines through the second data multiplexer, wherein the second data multiplexer and the plurality of first data multiplexers are located at a same side of the plurality of pixel units.

For example, the second repair line and the second data multiplexer are located at opposite sides of the display region, respectively.

For example, the second data multiplexer and the plurality of first data multiplexers share a same first control line and a same second control line.

For example, the display panel further includes an integrated circuit, wherein the integrated circuit is connected with the plurality of data transmission lines.

For example, in a same repair structure, the plurality of second repair lines and the first repair line are connected inside the integrated circuit.

For example, the repair structure further includes a third data multiplexer, the first repair line includes a plurality of first repair lines, and the plurality of first repair lines are connected with the integrated circuit through the third data multiplexer.

For example, the plurality of first repair lines are located in the peripheral region and located at one side of the third data multiplexer away from the display region.

For example, the second data multiplexer, the third data multiplexer, and the plurality of first data multiplexers are sequentially arranged in a first direction.

For example, the third data multiplexer and the plurality of first data multiplexers share a same first control line and a same second control line.

For example, in one of two repair structures that are symmetrically arranged, the plurality of second repair lines include two second repair lines, the plurality of first repair lines include two first repair lines, the first data multiplexer includes a first switching unit and a second switching unit, the second data multiplexer includes a third switching unit and a fourth switching unit, the third data multiplexer includes a fifth switching unit and a sixth switching unit, and the third switching unit, the fourth switching unit, the fifth switching unit, the sixth switching unit, the first switching unit and the second switching unit are sequentially arranged.

For example, the two first repair lines are respectively connected with the third data multiplexer through a first connection line, one of the two first repair lines is connected with a first signal line through the fifth switching unit, the other one of the two first repair lines is connected with a second signal line through the sixth switching unit, and the second signal line is overlapped with the first connection line.

For example, the two second repair lines are connected with a second connection line through the second data multiplexer, and the second connection line, the first signal line and the second signal line are sequentially arranged.

For example, the first repair line and the first connection line connected thereto are formed as an integral structure.

For example, the second connection line, the first signal line and the second signal line are connected inside the integrated circuit.

For example, the first repair line extends along a first direction, and a size, in the first direction, of a portion of the data transmission line overlapped with the first repair line is greater than a size, in the first direction, of a portion of the data transmission line not overlapped with the first repair line.

For example, the data transmission line has a plurality of first protruding portions, the plurality of first protruding portions are overlapped with the plurality of first repair lines, respectively, and the plurality of first protruding portions are located at a same side of the data transmission line.

For example, the data line has a second protruding portion, and two second protruding portions of two adjacent data lines are arranged, in a staggered manner, between the two adjacent data lines, or the two second protruding portions of the two adjacent data lines are arranged back to back.

For example, an insulating layer is disposed between the first repair line and the plurality of data transmission lines, and the insulating layer is disposed between the second repair line and the plurality of data lines.

For example, a portion of the data line overlapped with the second repair line is located in the peripheral region and located at one side of the display region away from the first repair line.

For example, the portion of the data line overlapped with the second repair line and a portion of the data line located in the display region are located in different layers.

At least one embodiment of the present disclosure provides a display device, including any of the display panels described above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For large and medium-sized display panels, display panels with high frame rate and refresh rate can be combined with a data multiplexer (Mux) so as to design a repair circuit.

Figure 1:
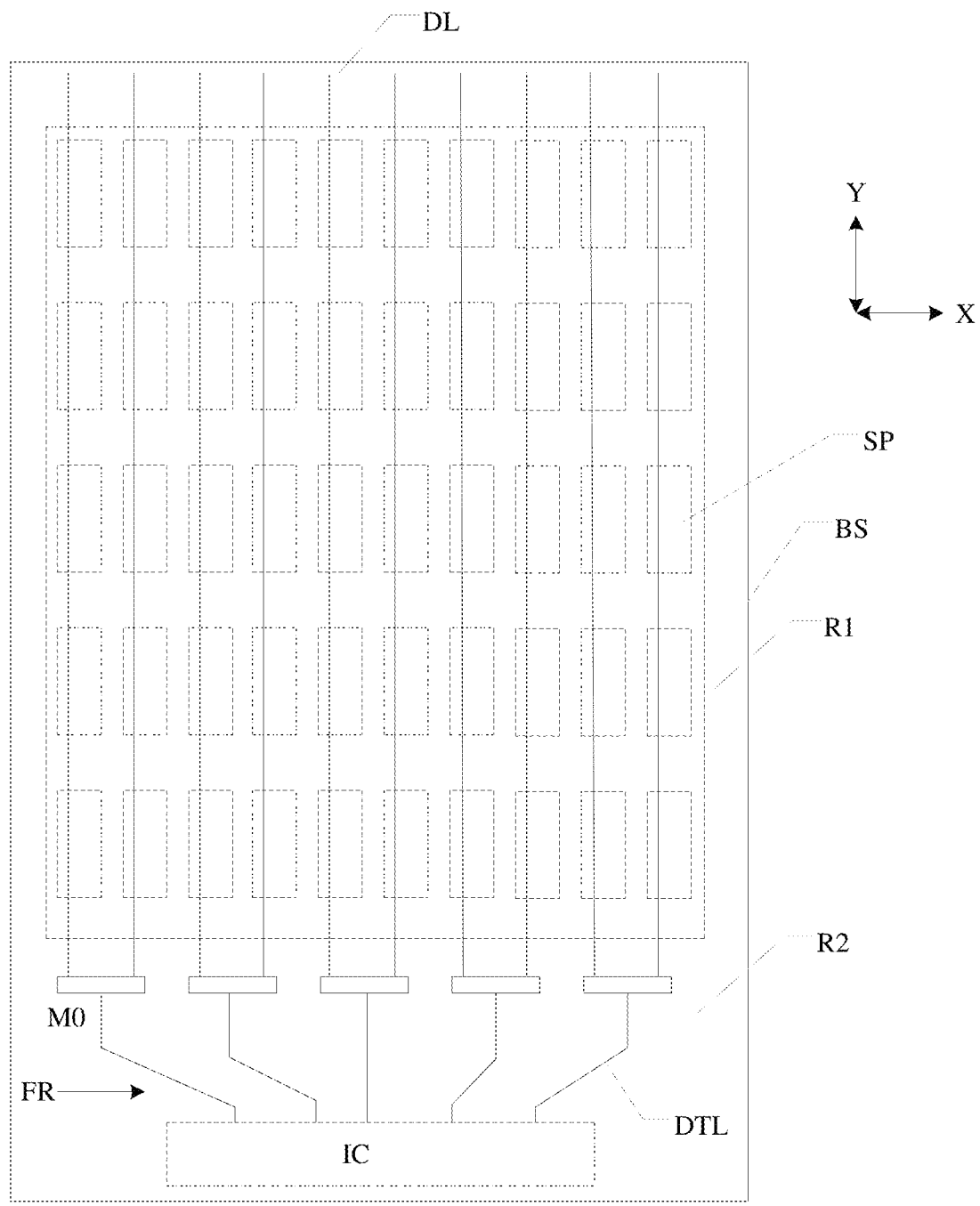
FIG. 1 is a schematic diagram of a display panel.

FIG. 1 is a schematic diagram of a display panel. The display panel includes a base substrate BS and a plurality of pixel units SP located on the base substrate. The plurality of pixel units SP can be arranged in an array. As shown in FIG. 1, one end of the data transmission line DTL is connected with at least two data lines DL through a data multiplexer M0, and the other end of the data transmission line DTL is connected with an integrated circuit IC, and the data lines DL are configured to input data signals to the plurality of pixel units SP. FIG. 1 takes the case where a data transmission line DTL is connected with two data lines DL through a data multiplexer M0 as an example, but it is not limited to this case. FIG. 1 illustratively shows components such as data multiplexers M0, pixel units SP, data lines DL and data transmission lines DTL, and the number of each component is not limited to that shown in the figure. FIG. 1 shows a display region R1 and a peripheral region R2 located at at least one side of the display region R1. A fan-out region FR is located in the peripheral region R2. As shown in FIG. 1, the plurality of data lines DL are arranged along a first direction X, and each data line DL extends along a second direction Y. The arrangement of the data multiplexer M0 is beneficial to obtain a display panel with high frame rate and high refresh rate.

Figure 2:
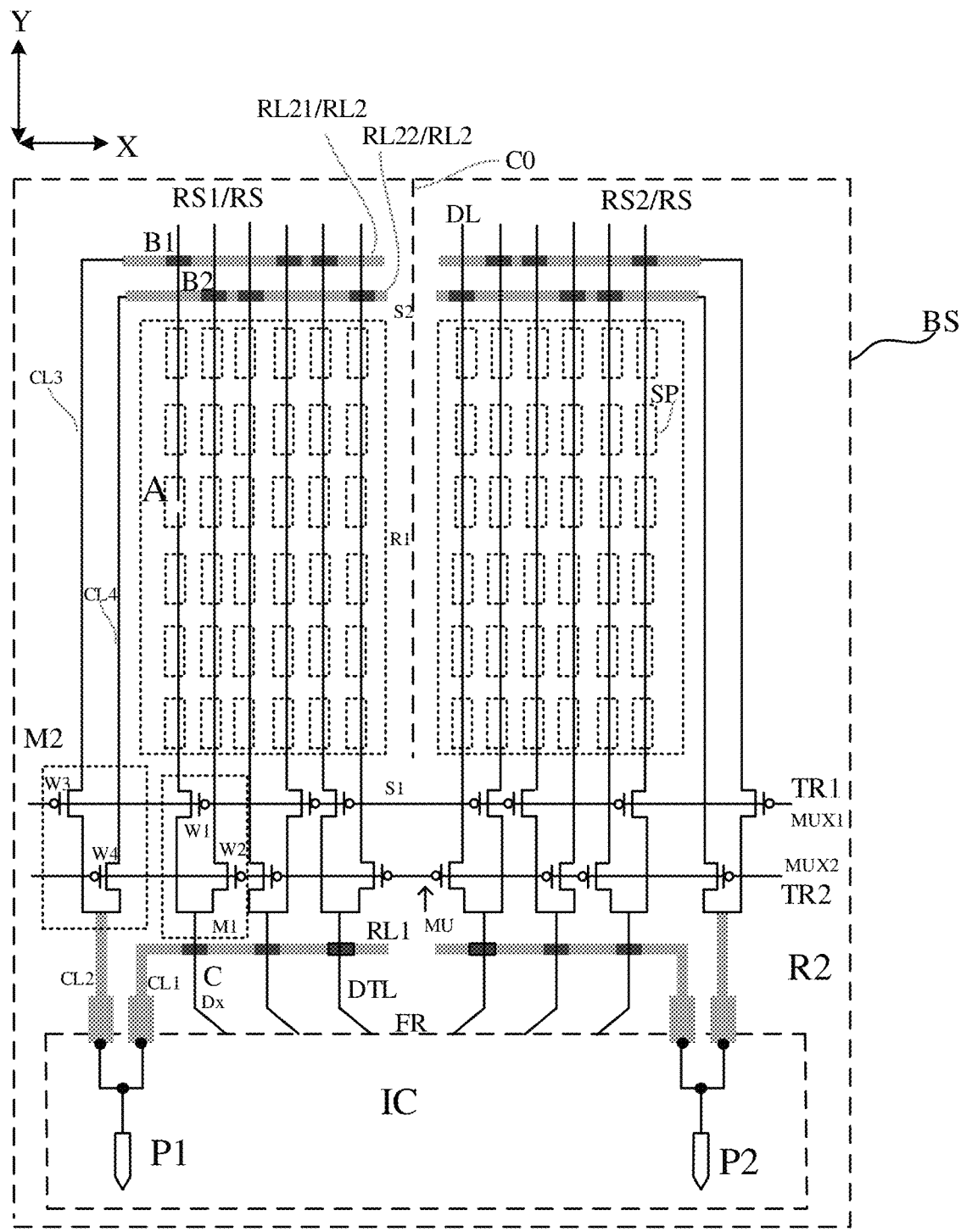
FIG. 2 is a schematic diagram of a display panel provided by an embodiment of the present disclosure.

FIG. 2 is a schematic diagram of a display panel provided by an embodiment of the present disclosure. FIG. 2 shows a display region R1 and a peripheral region R2 surrounding the display region R1. As shown in FIG. 2, the display panel includes a base substrate BS, a plurality of pixel units SP, a plurality of data lines DL, and a plurality of data transmission lines DTL. The plurality of pixel units SP are located in the display region R1 and are configured to display an image. The plurality of data lines DL are electrically connected with the plurality of pixel units SP. The plurality of data lines DL are configured to input data signals to the plurality of pixel units SP. For example, the plurality of pixel units SP are arranged in an array, and each data line DL is electrically connected with one column of pixel units SP. For example, each data line DL is configured to input a data signal to a column of pixel units SP. The plurality of data transmission lines DTL are connected with the plurality of data lines DL.

As shown in FIG. 2, the display panel includes two repair structures RS: a first repair structure RS1 and a second repair structure RS2. Each repair structure RS includes a first repair line RL1 and a second repair line RL2, and the first repair line RL1 is overlapped with a plurality of data transmission lines DTL. The second repair line RL2 is overlapped with a plurality of data lines DL. In the case where the display panel has a breakpoint, a connection can be built at a corresponding intersection point to repair the defect of breakage. The location of the intersection point includes at least one of the overlapping position between the first repair line RL1 and the data transmission line DTL, and the overlapping position between the second repair line RL2 and the data line DL. It should be noted that the display panel can include more repair structures RS. That is, the display panel includes at least two repair structures RS.

As shown in FIG. 2, the display panel includes a center line C0, and the two repair structures RS are axisymmetric with respect to the center line C0. That is, the first repair structure RS1 at the left side of the center line C0 and the second repair structure RS2 at the right side of the center line C0 are axisymmetric with respect to the center line C0. The center line C0 is just the symmetry axis C0.

It should be noted that a display panel may be provided with at least one center line C0, and the center line C0 is a dummy line separating two repair structures RS, and may not exist in actual products.

For example, in order to facilitate routing design, two repair structures in the at least two repair structures are arranged symmetrically. As shown in FIG. 2, the first repair structure RS1 and the second repair structure RS2 are arranged symmetrically with respect to the symmetry axis C0.

As shown in FIG. 2, in order to enable repairing more breakpoints, two first repair lines RL1 respectively belonging to two repair structures are disconnected at the symmetry axis C0. As shown in FIG. 2, the first repair line RL1 located at the left side and the first repair line RL1 located at the right side are disconnected at the symmetry axis C0, and have a gap there-between.

As shown in FIG. 2, in order to enable repairing more breakpoints, two second repair lines RL2 respectively belonging to two repair structures are disconnected at the symmetry axis C0. As shown in FIG. 2, the second repair line RL2 located at the left side and the second repair line RL2 located at the right side are disconnected at the symmetry axis C0 and have a gap there-between.

As shown in FIG. 2, the second repair line RL2 is located in the peripheral region R2 and at one side of the display region R1 away from the first repair line RL1.

As shown in FIG. 2, in a same repair structure, the first repair line RL1 and the second repair line RL2 are located at opposite two sides of the display region R1, respectively.

As shown in FIG. 2, the display panel includes a plurality of first data multiplexers M1, one first repair line RL1, a second data multiplexer M2, and two second repair lines RL2. The plurality of data transmission lines DTL are connected with the plurality of data lines DL through the plurality of first data multiplexers M1.

As shown in FIG. 2, the second repair line RL2 and the second data multiplexer M2 are located at opposite two sides of the display region R1, respectively. As shown in FIG. 2, the second repair line RL2 is located at the upper side of the display region R1, and the second data multiplexer M2 is located at the lower side of the display region R1.

As shown in FIG. 2, the first repair line RL1 is connected with two second repair lines RL2 through a second data multiplexer M2. The second data multiplexer M2 and the plurality of first data multiplexers M1 are located at a same side of the plurality of pixel units SP. The plurality of first data multiplexers M1 form a first data multiplexer unit MU, so that the first data multiplexer unit MU and the second data multiplexer M2 are located at the same side of the plurality of pixel units SP.

In the display panel provided by the embodiment of the present disclosure, a repair circuit is designed in combination with data multiplexers, and the second data multiplexer M2 and the plurality of first data multiplexers M1 are located at the same side of the plurality of pixel units SP, which is beneficial to manufacture the second data multiplexer M2 and makes the display panel compact in structure. Because the second data multiplexer M2 and the plurality of first data multiplexers M1 are located at the same side of the plurality of pixel units SP, the arrangement of control lines of the data multiplexers is facilitated, the routing is simple, and the bezel of the display panel is facilitated to be reduced.

In the embodiment of the present disclosure, two elements being overlapped means that orthographic projections of the two elements on the base substrate are at least partially overlapped.

For example, as shown in FIG. 2, the first repair line RL1 is located at a first side S1 of the plurality of pixel units SP, and two second repair lines RL2 are located at a second side S2 of the plurality of pixel units SP, and the first side S1 and the second side S2 are opposite two sides of the display panel.

In an embodiment of the present disclosure, in the case where two elements are located at a same side of a plurality of pixel units SP, it can be judged, by taking the region where the plurality of pixel units SP are located as a reference, whether the positions of the two elements are located at the same side of this region. Taking the display panel shown in FIG. 2 as an example, the plurality of pixel units SP are located in a rectangular region, then the rectangular region includes four sides: an upper side, a lower side, a left side and a right side. In the display panel shown in FIG. 2, the second data multiplexer M2 and the plurality of first data multiplexers M1 are located at the lower side of the plurality of pixel units SP.

Referring to FIG. 1 and FIG. 2, the fan-out region FR is located in the peripheral region R2. The fan-out region FR will be described later.

For example, as shown in FIG. 2, the second data multiplexer M2 and the plurality of first data multiplexers M1 are located between a region where the plurality of pixel units SP are located and a region where the plurality of data transmission lines DTL are located. That is, the second data multiplexer M2 and the plurality of first data multiplexers M1 are located between the plurality of pixel units SP in the display region R1 and the plurality of data transmission lines DTL in the peripheral region R2.

As shown in FIG. 2, the display panel further includes an integrated circuit IC, and the integrated circuit IC is connected with the plurality of data transmission lines DTL.

As shown in FIG. 2, taking the case where the leftmost data line DL is disconnected at a breakpoint A as an example, point B1 and point C can be welded to be connected, and a signal as same as the signal on the data transmission line Dx is supplied to a first pin P1 through the integrated circuit IC, so that the data transmission line Dx is connected with a part of the data line at the upper side of the breakpoint A through a repair structure. The first repair line RL1 repairs the pixel unit SP at the lower side of the breakpoint A, and one of the two second repair lines RL2 repairs the pixel unit SP at the upped side of the breakpoint A, so that the signals on the two separated parts of the data line are consistent, thus repairing the defect of breakage of the display panel. Accordingly, in the case where any other data line DL of the display panel is disconnected, the overlapping position between the first repair line RL1 and the data transmission line DTL connected with the disconnected data line, and the overlapping position between the disconnected data line and the second repair line RL2, can be welded to be connected, so that the disconnected data line DL can be repaired. During the welding operation, laser can be used, and the insulating layer at the laser irradiation position is ablated, so that two wires overlapped at the ablation position on both sides of the insulating layer are in contact, thus realizing the repair of breakage. The two wires include a second repair line RL2 and a data line DL, and the two wires include a first repair line RL1 and a data transmission line DTL.

For example, the first repair structure RS1 in FIG. 2 can repair one breakpoint in the display region, and the second repair structure RS2 in FIG. 2 can repair one breakpoint in the display region. The two repair structures in FIG. 2 can repair two breakpoints in the display region.

As shown in FIG. 2, the plurality of pixel units SP are arranged in an array, the plurality of data lines DL are arranged along a first direction X, each data line DL extends along a second direction Y, and one data line is configured to be connected with one column of pixel units SP. As shown in FIG. 2, the plurality of data lines DL are insulated from each other, so that signals can be supplied to corresponding columns of pixel units SP, respectively. However, the embodiment of the present disclosure is not limited to this case, and two adjacent data lines may be connected with the odd row of pixel units and the even row of pixel units in the same column, respectively, that is, in a dual data mode.

For example, as shown in FIG. 2, the two second repair lines RL2 and the first repair line RL1 are connected inside the integrated circuit IC. As shown in FIG. 2, the two second repair lines RL2 and the first repair line RL1 are all connected with the first pin P1 of the integrated circuit IC.

As shown in FIG. 2, the first repair line RL1 is overlapped with the data transmission line DTL which is connected with the data line DL to be repaired, the first repair line RL1 is connected with the integrated circuit IC through a first connection line CL1, and the integrated circuit IC is connected with one end of the second data multiplexer M2 through a second connection line CL2. The other end of the second data multiplexer M2 is connected with two second repair lines RL2 through a third connection line CL3 and a fourth connection line CL4, respectively. That is, as shown in FIG. 2, the two second repair lines RL2 include: a second repair line RL21 which is connected with the second data multiplexer M2 through the third connection line CL3; and a second repair line RL22 which is connected with the second data multiplexer M2 through the fourth connection line CL4.

As shown in FIG. 2, the first repair line RL1 extends along the first direction X, the second repair line RL2 extends along the first direction X, and the two second repair lines RL2 are arranged along the second direction Y. For example, as shown in FIG. 2, both the third connection line CL3 and the fourth connection line CL4 extend along the second direction Y. In the embodiments of the present disclosure, that an element extends along a certain direction refers to the general extension trend of the element, and does not mean that every part of the element extends along that direction.

For example, in the embodiment of the present disclosure, the first data multiplexer M1 includes two switching units, for example, a first switching unit W1 and a second switching unit W2. At a first moment, one of the first switching unit W1 and the second switching unit W2 is turned on to transmit the signal on the data transmission line DTL to one of the two data lines DL connected with the first data multiplexer M1; and at a second moment, the other one of the first switching unit W1 and the second switching unit W2 is turned on to transmit the signal on the data transmission line DTL to the other one of the two data lines DL connected with the first data multiplexer M1.

For example, in the embodiment of the present disclosure, the second data multiplexer M2 includes two switching units, for example, a third switching unit M3 and a fourth switching unit M4. At the first moment, one of the third switching unit M3 and the fourth switching unit M4 is turned on to transmit the signal on the first repair line RL1 to one of the second repair line RL21 and the second repair line RL22; and at the second moment, the other one of the third switching unit M3 and the fourth switching unit M4 is turned on to transmit the signal on the first repair line RL1 to the other one of the second repair line RL21 and the second repair line RL22.

As shown in FIG. 2, the first switching unit W1 includes a first transistor, the second switching unit W2 includes a second transistor, the third switching unit M3 includes a third transistor, and the fourth switching unit M4 includes a fourth transistor, but the embodiment is not limited to this case.

In an embodiment of the present disclosure, in order to distinguish the two electrodes of the transistor other than the gate electrode, it is directly described that one electrode is a first electrode and the other electrode is a second electrode, so the first electrode and the second electrode of all or part of the transistors in the embodiment of the present disclosure can be interchanged as needed. For example, in the embodiment of the present disclosure, the first electrode of the transistor can be a source electrode and the second electrode of the transistor can be a drain electrode; or, the first electrode of the transistor is the drain electrode, and the second electrode of the transistor is the source electrode. In order to control the turn-on and turn-off of the transistor, the gate electrode of the transistor is connected with a control line. For example, the transistor in the embodiment of the present disclosure includes a thin film transistor, but is not limited thereto.

For example, as shown in FIG. 2, the second data multiplexer M2 and the plurality of first data multiplexers M1 share a same first control line TR1 and a same second control line TR2.

Figure 3:
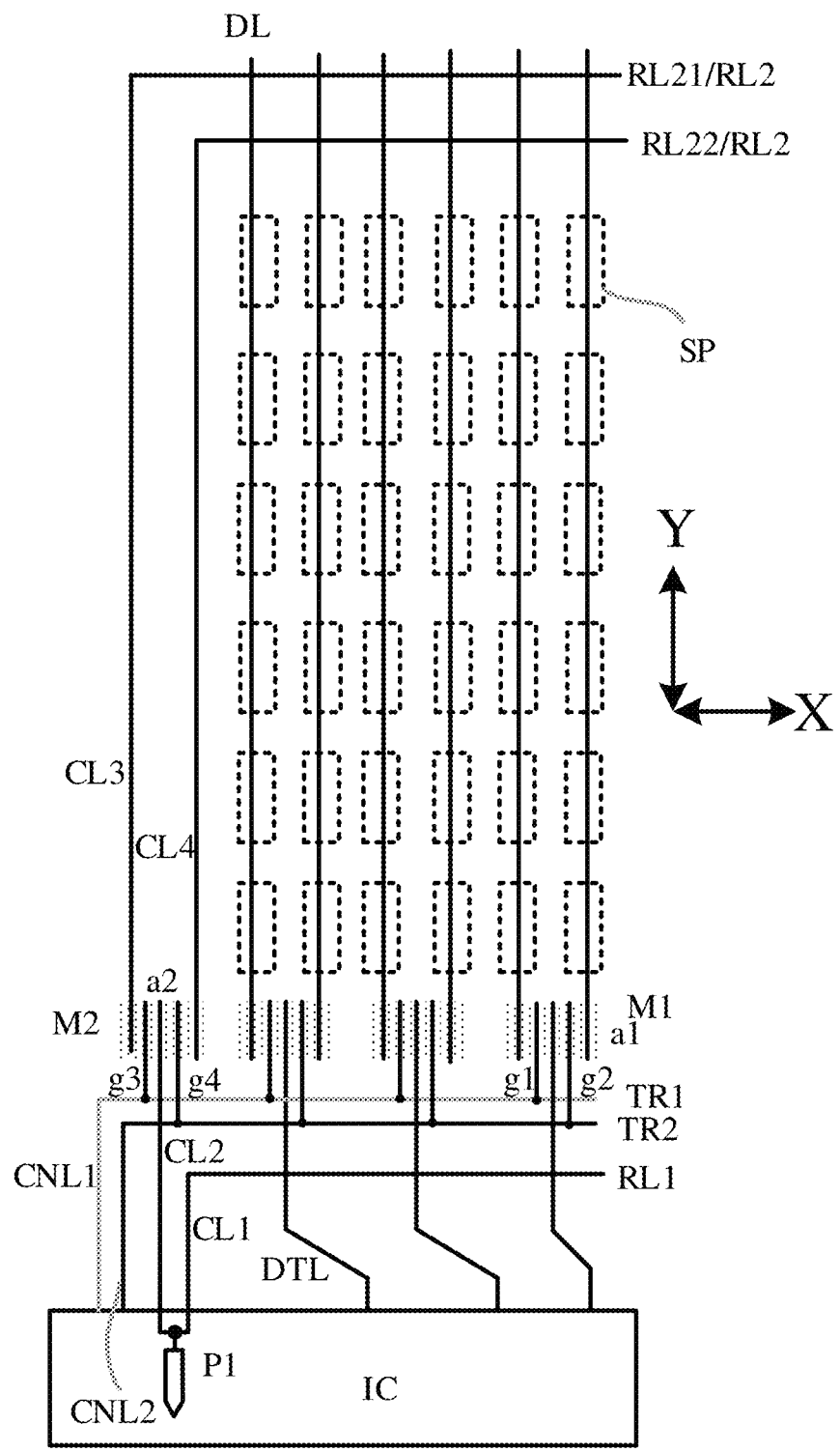
FIG. 3 is a partial schematic diagram of a display panel provided by an embodiment of the present disclosure.

FIG. 3 is a partial schematic diagram of a display panel provided by an embodiment of the present disclosure. As shown in FIG. 3, the first gate electrode g1 of the first transistor and the third gate electrode g3 of the third transistor are both connected with the first control line TR1. As shown in FIG. 3, the second gate electrode g2 of the second transistor and the fourth gate electrode g4 of the fourth transistor are both connected with the second control line TR2.

For example, the first control line TR1 and the second control line TR2 can be low-level signal lines or high-level signal lines. By inputting control signals to the first control line TR1 and the second control line TR2 in different time periods, the first switching unit W1 and the second switching unit W2 can be turned on in different time periods, and the third switching unit W3 and the fourth switching unit W4 can be turned on in different time periods. As shown in FIG. 3, the first data multiplexer M1 includes a semiconductor active layer a1, and different parts of the semiconductor active layer a1 serve as active layers of the first transistor and the second transistor, respectively; and the second data multiplexer M2 includes a semiconductor active layer a2, and different parts of the semiconductor active layer a2 serve as active layers of the third transistor and the fourth transistor, respectively.

For example, as shown in FIG. 3, the first control line TR1 is connected with the integrated circuit IC through a connection line CNL1, and the second control line TR2 is connected with the integrated circuit IC through a connection line CNL2. The first control line TR1 and the second control line TR2 are located between the first repair line RL1 and a region where the semiconductor active layer a1 and the semiconductor active layer a2 are located.

For example, as shown in FIG. 3, the first control line TR1 and the second control line TR2 both extend along the first direction X; and the connection line CNL1 and the connection line CNL2 extend along the second direction Y.

Figure 4:
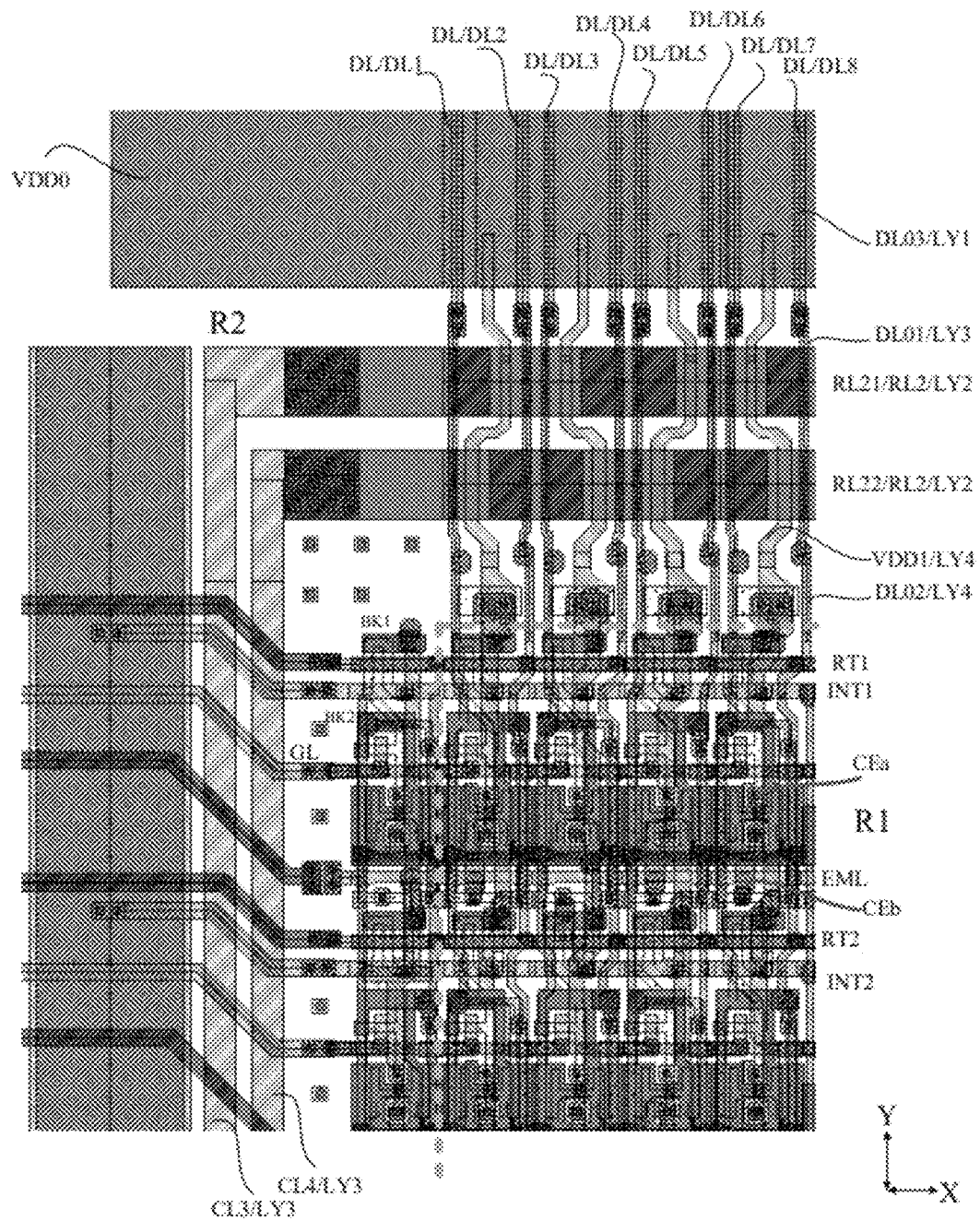
FIG. 4 is a partial layout diagram of a display panel provided by an embodiment of the present disclosure.

FIG. 4 is a partial layout diagram of a display panel provided by an embodiment of the present disclosure. FIG. 4 shows a partial structure located at the upper side of the display region of the display panel, and the upper side of the display region is a side opposite to the side where the integrated circuit is arranged. The structure includes: two second repair lines RL2, i.e., the second repair line RL21 and the second repair line RL22; a third connection line CL3 connected with the second repair line RL21; and a fourth connection line CL4 connected with the second repair line RL22. FIG. 4 shows eight data lines DL, namely data lines DL1 to DL8. The display panel shown in FIG. 4 is an organic light-emitting diode display panel. A first power line VDD1 is arranged between adjacent data lines DL, and the first power line VDD1 is connected with a first power bus VDD0. FIG. 4 also shows structures such as a first reset signal line RT1, a second reset signal line RT2, a light-emitting control signal line EML, a first initialization signal line INT1 and a second initialization signal line INT2, etc. The organic light-emitting diode display panel will be described in detail later.

For example, referring to FIG. 4, the second repair line RL2 extends along the first direction X; and the size, in the first direction X, of a portion of the data line DL overlapped with the second repair line RL2 is greater than the size, in the first direction X, of a portion of the data line DL not overlapped with the second repair line RL2. The size of the data line DL becomes larger at the overlapping position, which is beneficial to the welding process.

Figure 5:
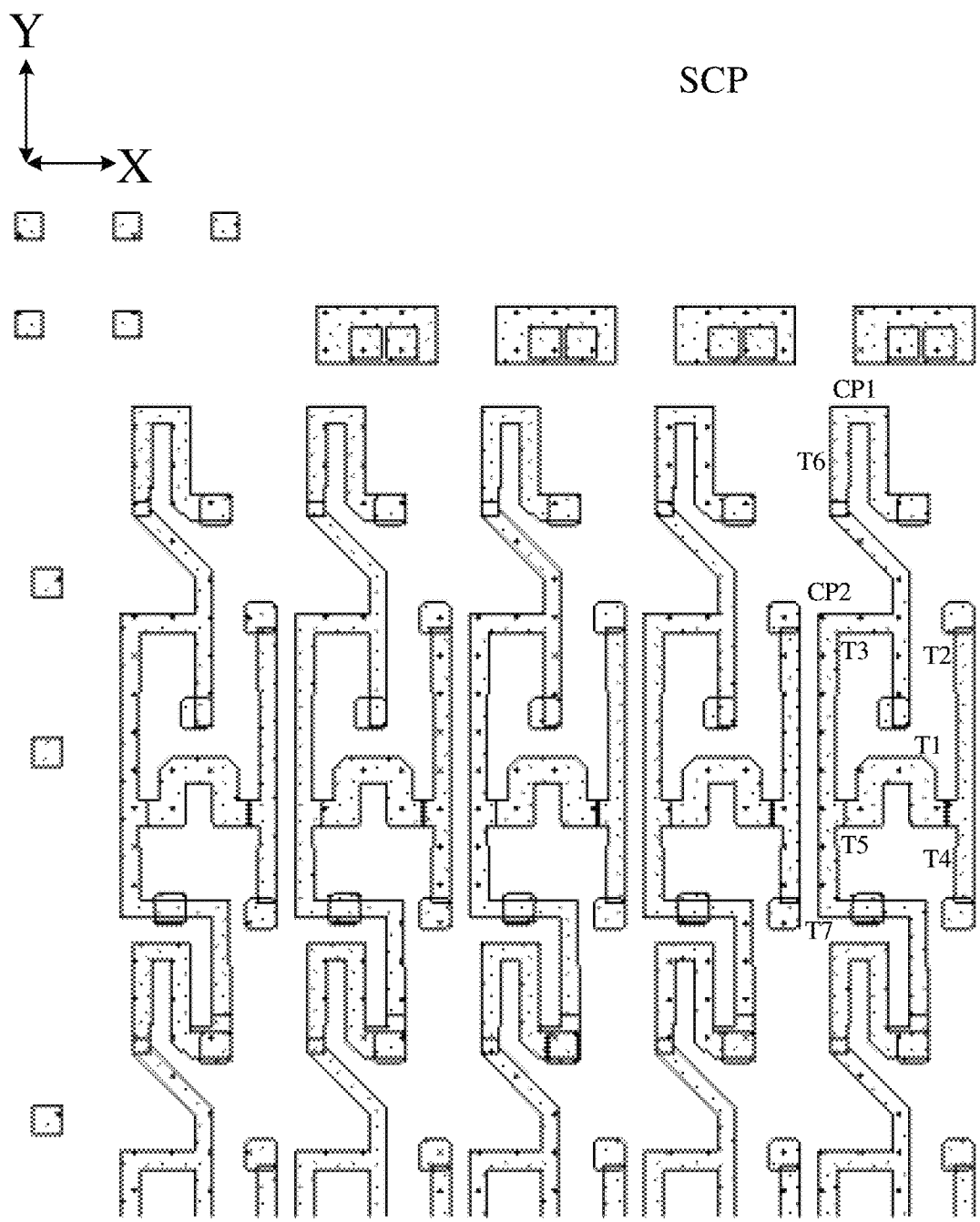
FIG. 5 to FIG. 10C are plan views of some film layers of the display panel shown in FIG. 4.
Figure 6:
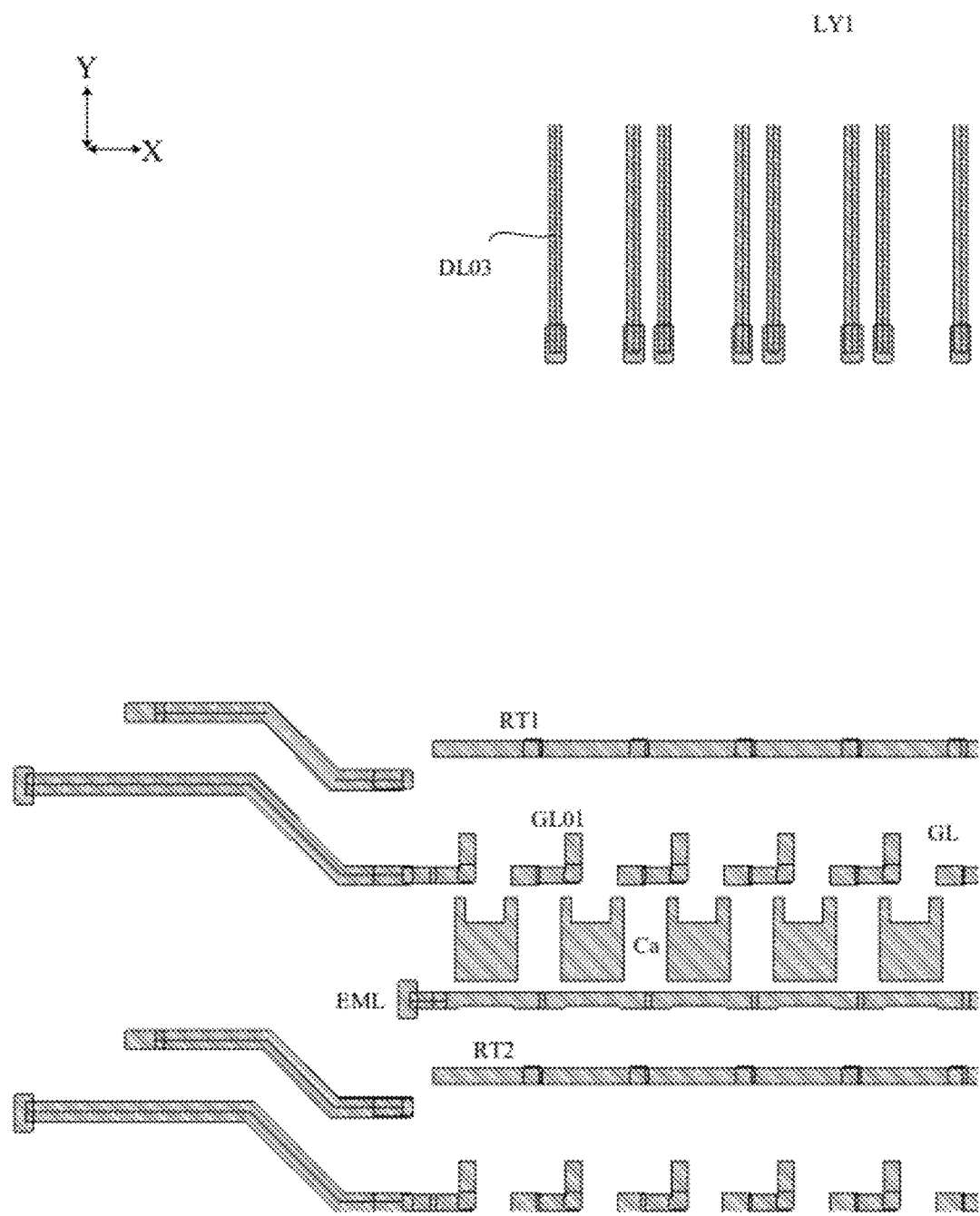
Figure 7:
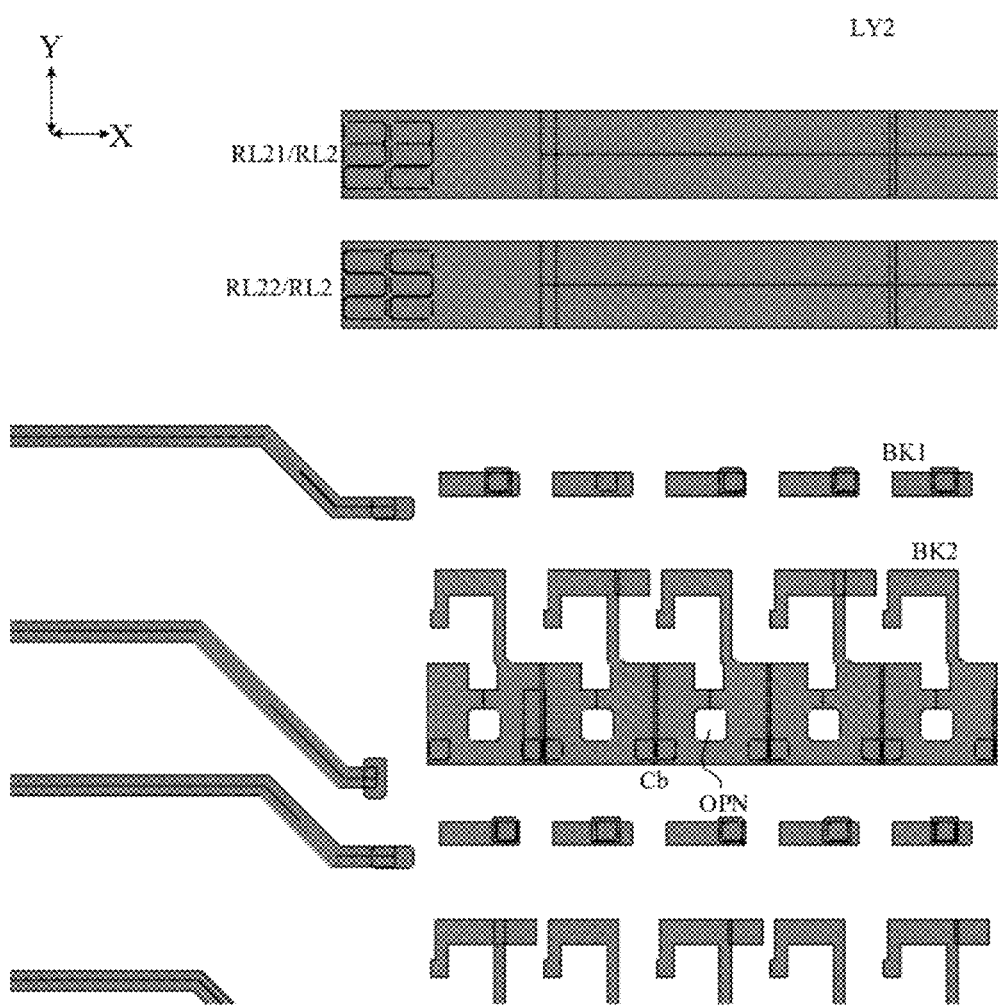
Figure 8:
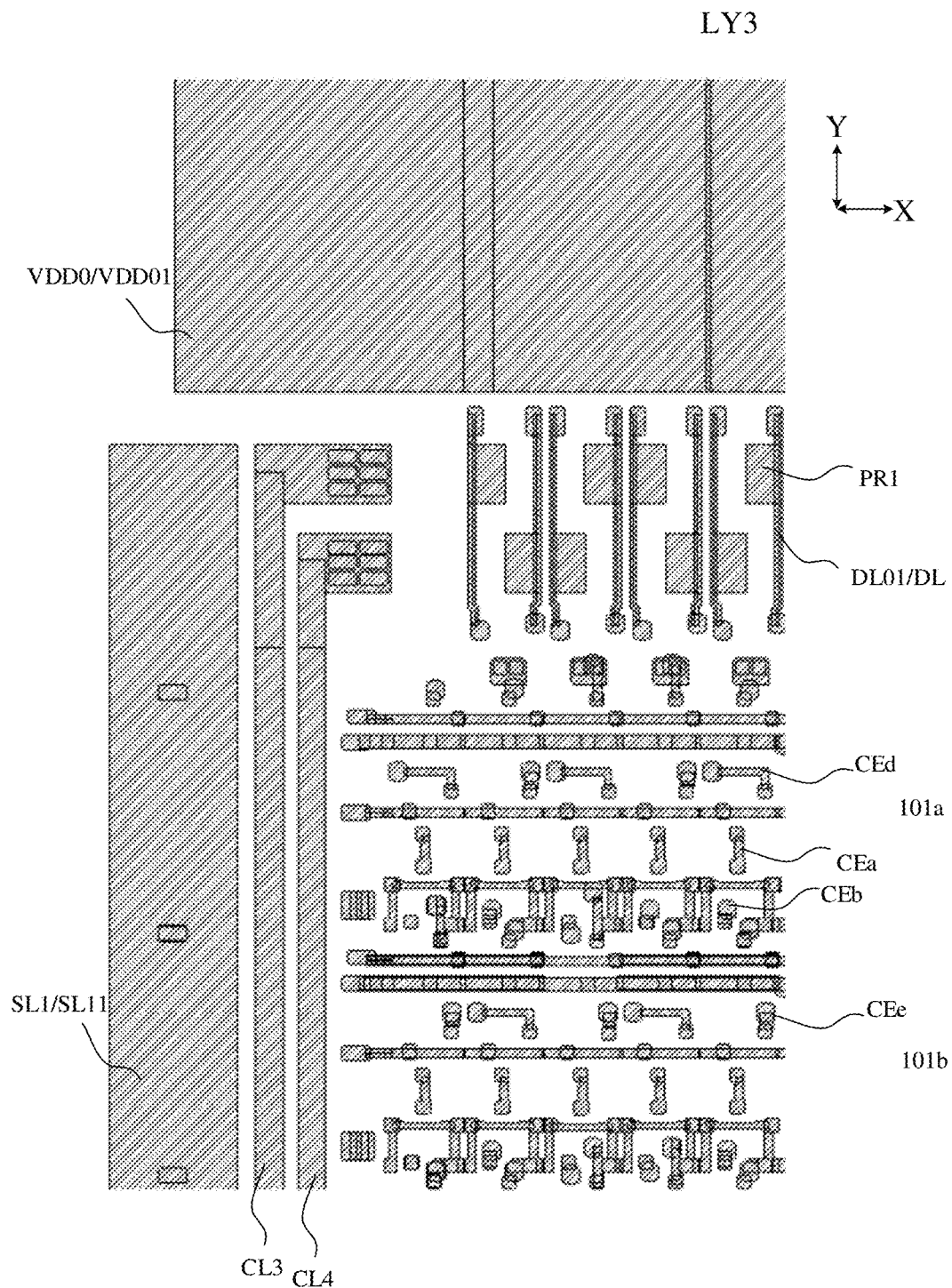
Figure 9:
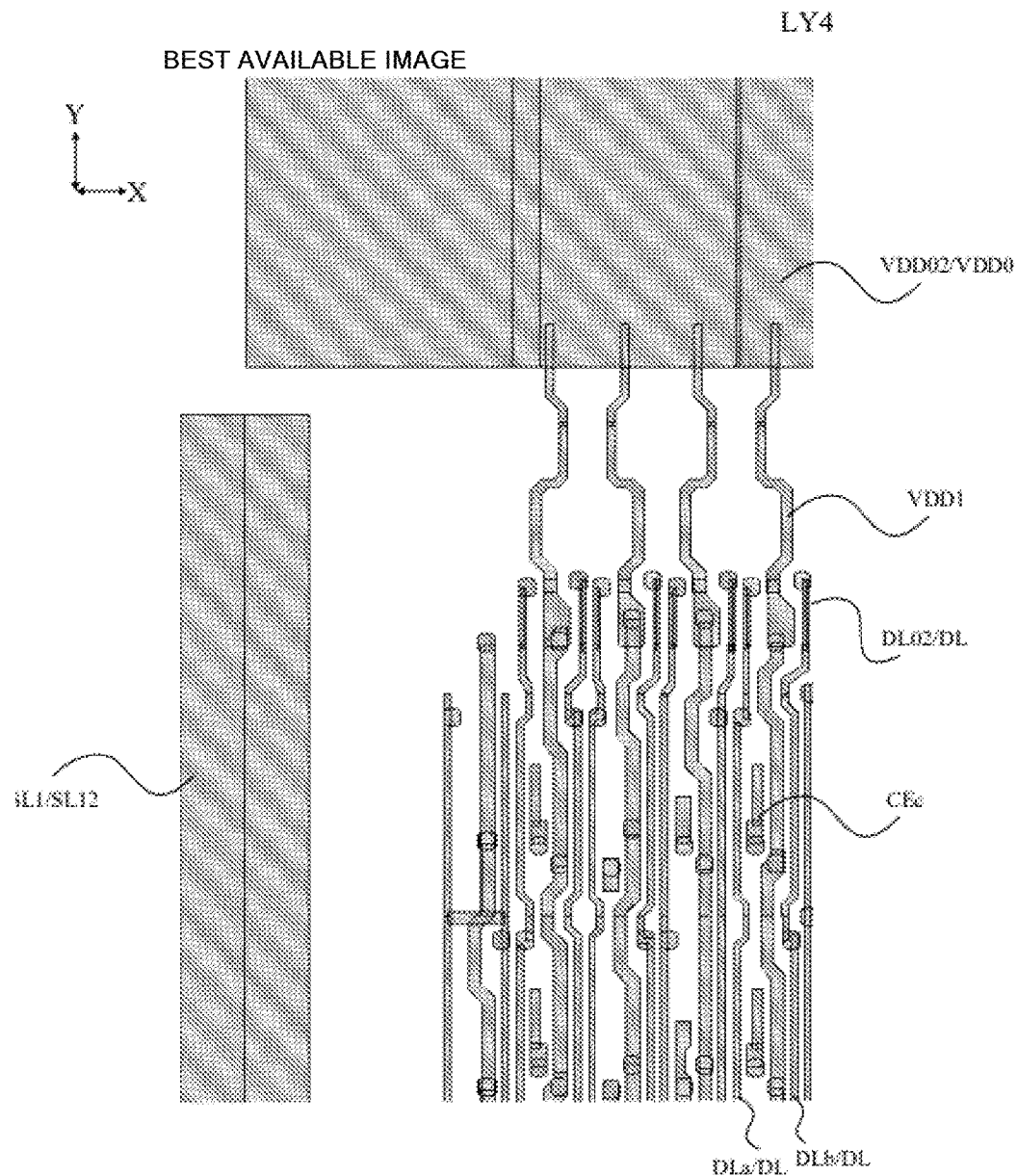

FIG. 5 to FIG. 10C are plan views of some film layers of the display panel shown in FIG. 4. FIG. 5 is a plan view of an active layer pattern SCP in the display panel shown in FIG. 4. As shown in FIG. 5, the active layer pattern SCP includes a semiconductor active layer, a source region and a drain region. FIG. 6 is a plan view of a first conductive pattern in the display panel shown in FIG. 4. As shown in FIG. 6, the first conductive pattern LY1 includes a third portion DL03 of the data line, a first reset signal line RT1, a second reset signal line RT2, a light-emitting control signal line EML, a first electrode Ca of a storage capacitor, and a first portion GL01 of a gate line GL. FIG. 7 is a plan view of a second conductive pattern LY2 in the display panel shown in FIG. 4. As shown in FIG. 7, the second conductive pattern LY2 includes two second repair lines RL2, a first block portion BK1, a second block portion BK2, and a second electrode Cb of the storage capacitor, and the second electrode Cb of the storage capacitor is provided with an opening OPN. As shown in FIG. 7, the second block portion BK2 and the second electrode Cb of the storage capacitor is formed as an integral structure. FIG. 8 is a plan view of a third conductive pattern LY3 in the display panel shown in FIG. 4. As shown in FIG. 8, the third conductive pattern LY3 includes a first portion DL01 of the data line DL, a connection electrode CEa, a connection electrode CEb, a connection electrode CEd, a connection electrode CEe, a third connection line CL3, and a fourth connection line CL4. FIG. 9 is a plan view of a fourth conductive pattern LY4 in the display panel shown in FIG. 4. As shown in FIG. 9, the fourth conductive pattern LY4 includes a connection electrode CEc, a second portion DL02 of the data line, and a first power line VDD1. FIG. 8 and FIG. 9 also show a signal line SL1, and the signal line SL1 includes a first portion SL11 and a second portion SL12. The first portion SL11 and the second portion SL12 can be connected through a via hole. FIG. 8 and FIG. 9 also show a first power bus VDD0, the first power bus VDD0 includes a first portion VDD01 and a second portion VDD02, and the first portion VDD01 and the second portion VDD02 can be connected through a via hole. For example, the signal line SL1 can be configured to transmit an initialization signal.

Figure 10A:
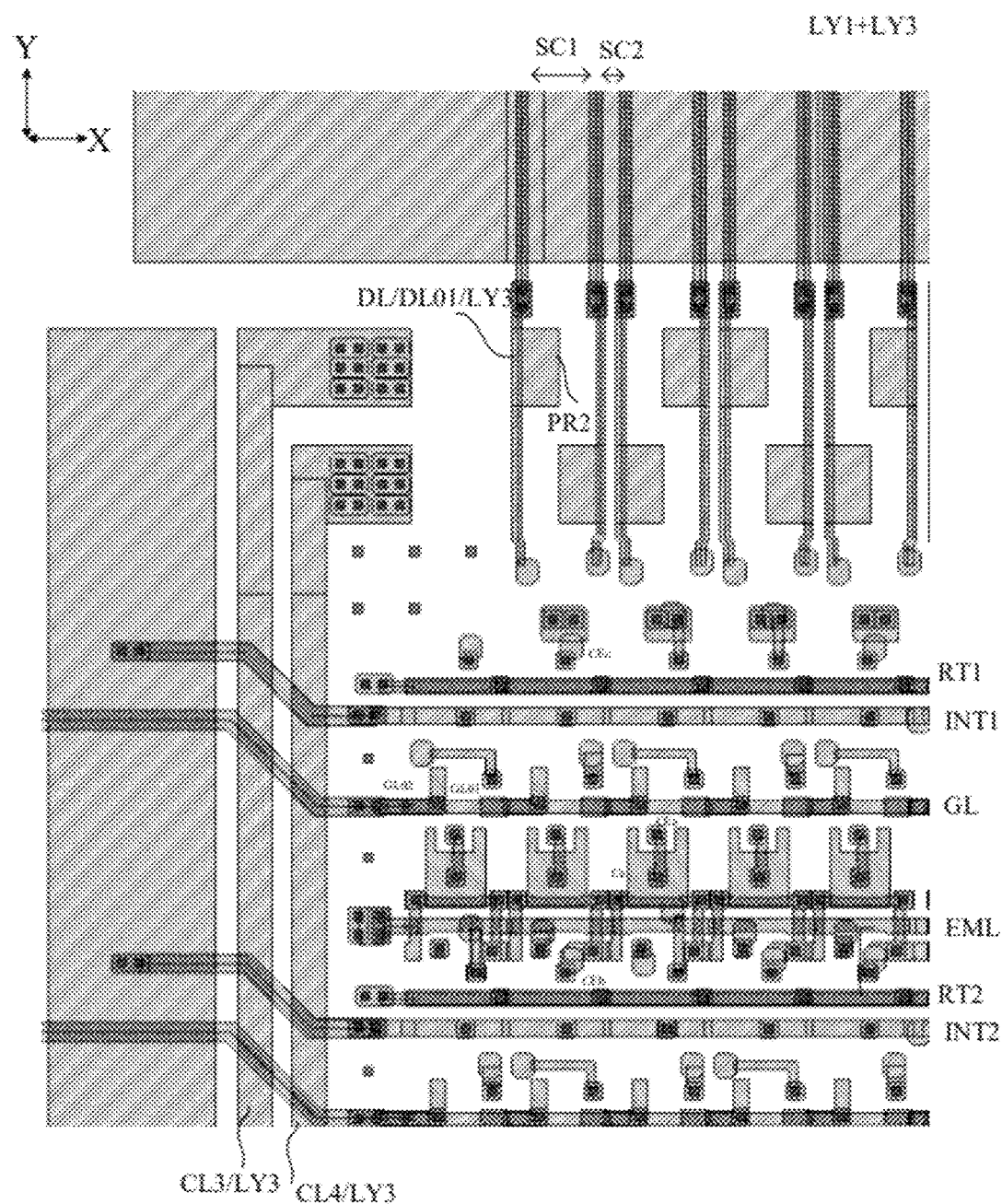
Figure 10B:
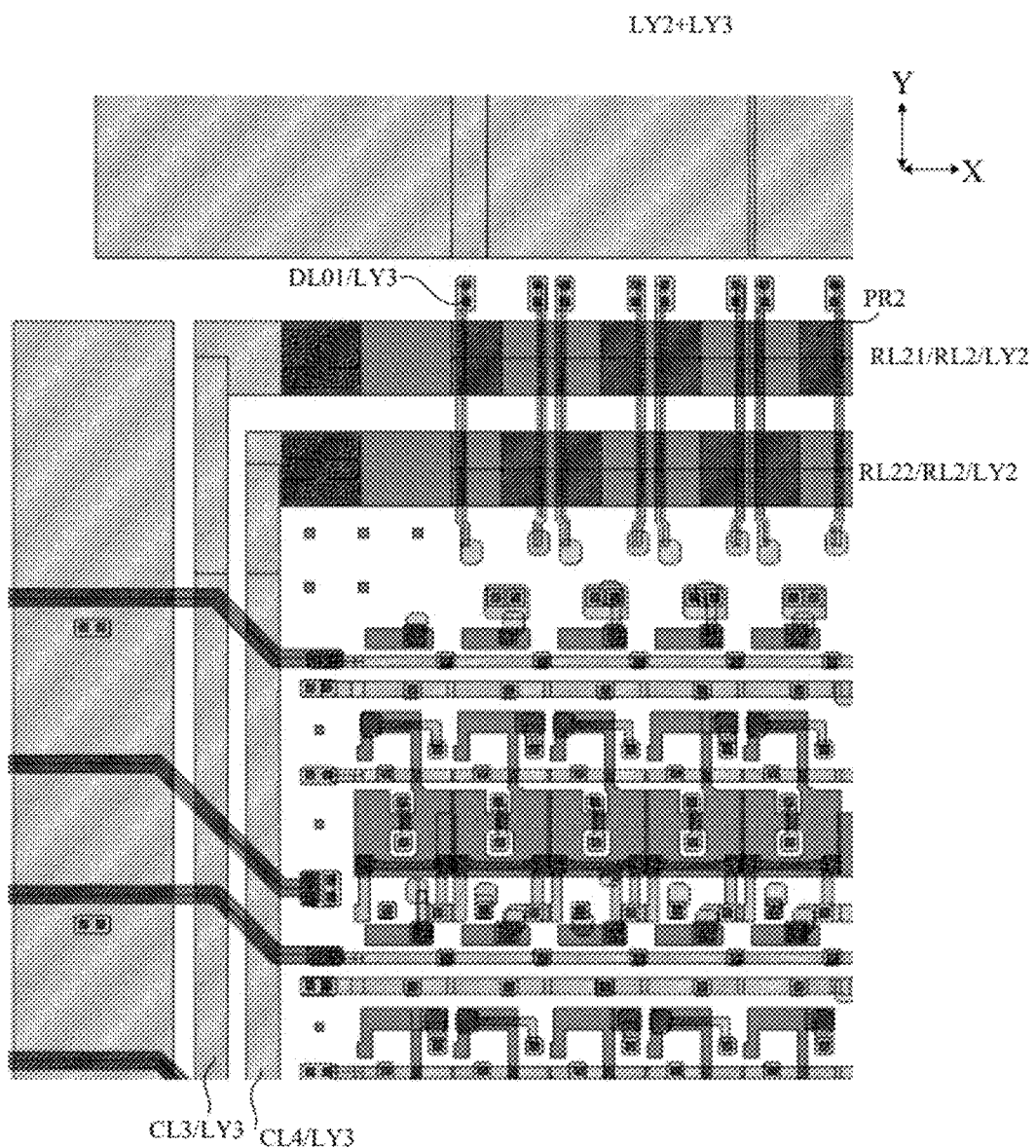
Figure 10C:
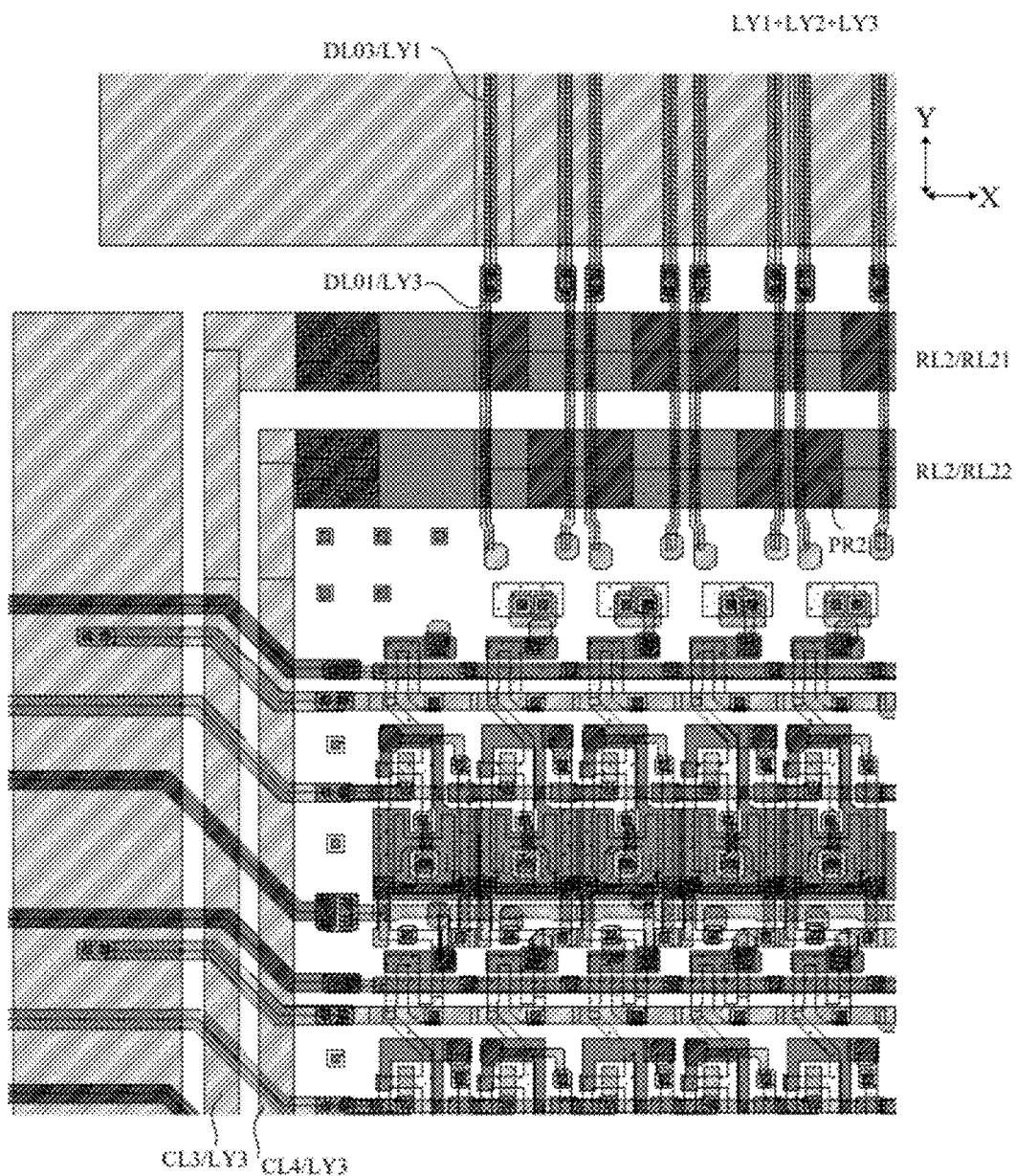

FIG. 10A is a plan view of the first conductive pattern LY1 and the third conductive pattern LY3 in the display panel shown in FIG. 4. As shown in FIG. 10A, the first portion DL01 of the data line DL and the third portion DL03 of the data line DL are connected through a via hole. FIG. 10B is a plan view of the second conductive pattern LY2 and the third conductive pattern LY3 in the display panel shown in FIG. 4. As shown in FIG. 10A and FIG. 10B, the second repair line RL21 and the third connection line CL3 are connected through a via hole, and the second repair line RL22 and the fourth connection line CL4 are connected through a via hole. FIG. 10C is a plan view of the first conductive pattern LY1, the second conductive pattern LY2 and the third conductive pattern LY3 in the display panel shown in FIG. 4.

Referring to FIG. 10A to FIG. 10C, for example, the data line DL has a second protruding portion PR2, and two second protruding portions PR2 of two adjacent data lines DL are arranged in a staggered manner between the two adjacent data lines DL; or the two second protruding portions PR2 of the two adjacent data lines DL are arranged back to back, that is, arranged at the outer side of the two adjacent data lines DL. As shown in FIG. 10A to FIG. 10C, two second protruding portions PR2 of two adjacent data lines DL with a first spacing SC1 are arranged in a staggered manner between the two adjacent data lines DL. As shown in FIG. 10A to FIG. 10C, two second protruding portions PR2 of two adjacent data lines DL with a second spacing SC2 are arranged back to back. The second spacing SC2 is smaller than the first spacing SC1. The staggered arrangement manner and the back-to-back arrangement manner avoid short circuit of adjacent data lines during welding.

Referring to FIG. 4, FIG. 6, FIG. 8, FIG. 10A and FIG. 10C, the data line DL includes a first portion DL01, a second portion DL02 and a third portion DL03. The first portion DL01, the second portion DL02 and the third portion DL03 are located in different layers; the first portion DL01 and the second portion DL02 are connected through a via hole, and the first portion DL01 and the third portion DL03 are connected through a via hole.

In the embodiment of the present disclosure, two elements being connected through a via hole means that one of the two elements fills a via hole in an insulating layer located between the two elements, so that the two elements are in contact and are connected together.

Referring to FIG. 8 and FIG. 9, the third conductive pattern layer LY3 includes a connection electrode CEd and a connection electrode CEe, the fourth conductive pattern layer LY4 includes a plurality of data lines DL, the plurality of data lines DL include a data line DLa and a data line DLb, the data line DLa and the data line DLb are adjacent to each other, the data line DLa is connected with the connection electrode CEd, and the data line DLb is connected with the connection electrode CEe. The connection electrode CEd is connected with the first electrode T21 of the data writing transistor T2 of a corresponding pixel unit 101a, and the connection electrode CEe is connected with the first electrode T21 of the data writing transistor T2 of a corresponding pixel unit 101b. The pixel unit 101a and the pixel unit 101b are located in a same column and adjacent in the row direction.

In the embodiment of the present disclosure, an element A and an element B being adjacent means that there is neither other element A nor other element B there-between, but it is not excluded that there is other element other than element A and element B there-between.

Figure 11:
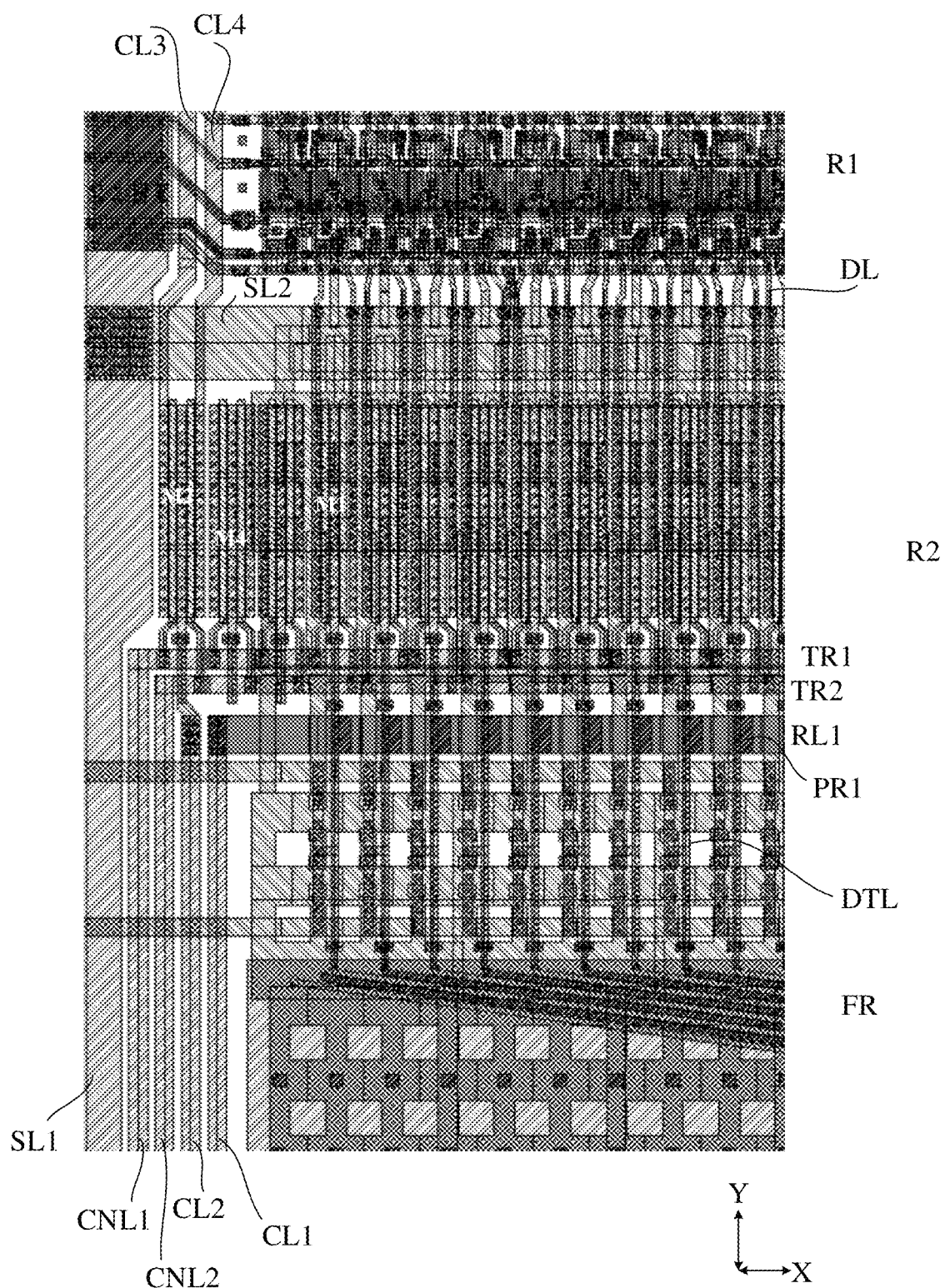
FIG. 11 is a partial layout diagram of a display panel provided by an embodiment of the present disclosure.

FIG. 11 is a partial layout diagram of a display panel provided by an embodiment of the present disclosure. Referring to FIG. 11 and FIG. 3, a portion of the second connection line CL2 serves as a signal input terminal of the second data multiplexer M2, for example, serving as the first electrode or the second electrode of two transistors; the second connection line CL2 is overlapped with the first control line TR1, and the second connection line CL2 is overlapped with the second control line TR2. The first repair line RL1 is connected with the integrated circuit IC through the first connection line CL1, and the second connection line CL2 is connected with the integrated circuit IC. For example, the first connection line CL1 and the second connection line CL2 are connected with a same pin of the integrated circuit IC.

For example, as shown in FIG. 11, the third connection line CL3 and the fourth connection line CL4 are signal output terminals of the second data multiplexer M2. Referring to FIG. 11 and FIG. 4, two second repair lines RL2 are signal output terminals of the second data multiplexer M2.

For example, as shown in FIG. 11, the data transmission line DTL has a first protruding portion PR1, the first protruding portion is overlapped with the first repair line RL1, and two adjacent first protruding portions PR1 face towards a same side of the display panel. FIG. 11 takes the case where two adjacent first protruding portions PR1 face towards the right side of the display panel as an example.

For example, as shown in FIG. 11, a portion of the data transmission line DTL extends along the second direction Y. As shown in FIG. 4, the data line DL extends along the second direction Y. Referring to FIG. 11 and FIG. 4, a portion of the data transmission line DTL and the data line DL extend along the same direction.

For example, as shown in FIG. 4, a portion of the data line DL overlapped with the second repair line RL2 is located in the peripheral region R2. Referring to FIG. 2 and FIG. 4, the portion of the data line DL overlapped with the second repair line RL2 is located at one side of the display region R1 away from the first repair line RL1.

For example, as shown in FIG. 4, FIG. 6 and FIG. 8 to FIG. 10C, the portion of the data line DL overlapped with the second repair line RL2 and a portion of the data line DL located in the display region R1 are located in different layers. That is, as shown in FIG. 8, the first portion DL01 of the data line DL is located in the third conductive pattern layer LY3; and as shown in FIG. 9, the second portion DL02 of the data line is located in the fourth conductive pattern layer LY4; and the first portion DL01 and the second portion DL02 are located in different layers.

Figure 12:
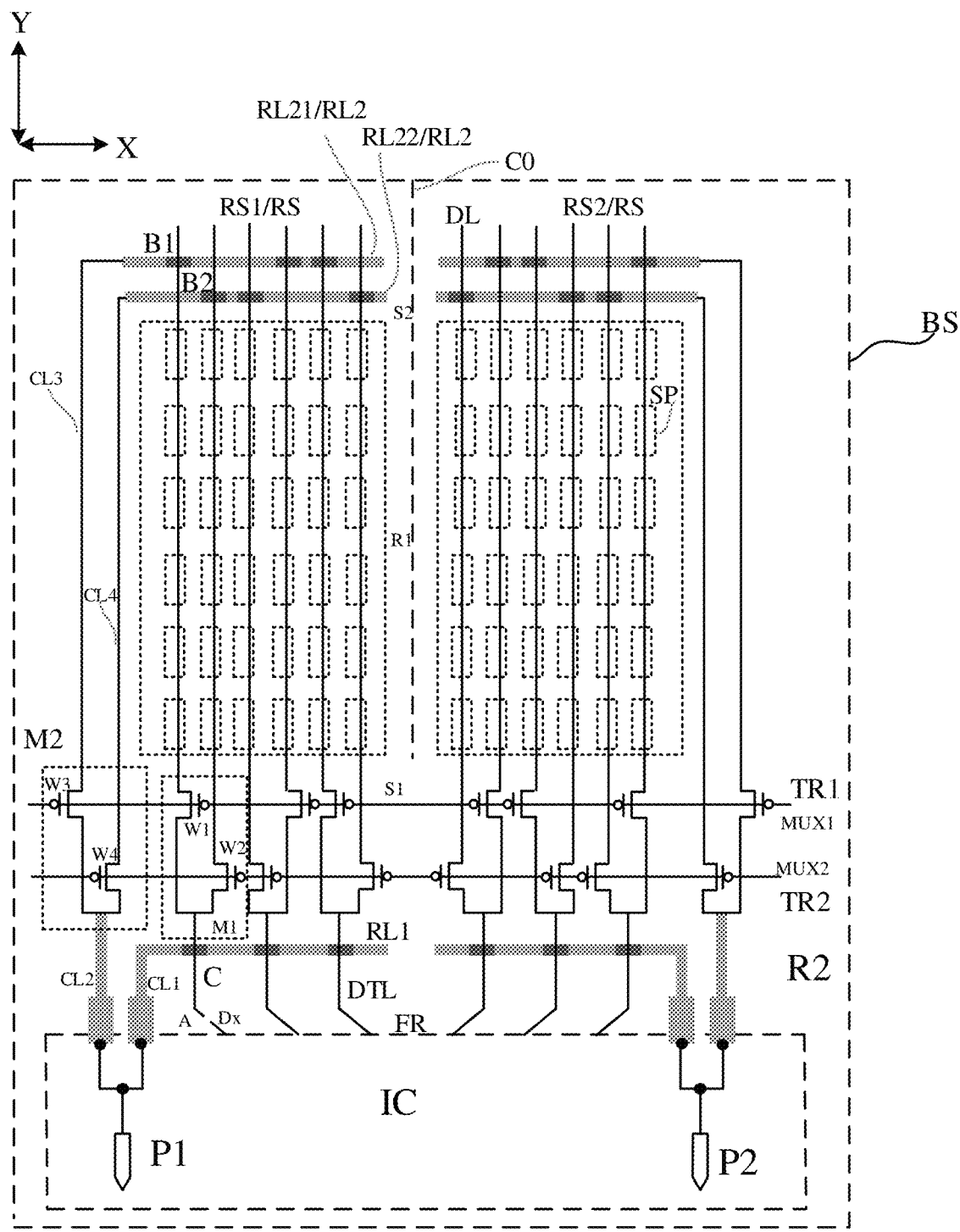
FIG. 12 is a schematic diagram of a display panel provided by an embodiment of the present disclosure.

FIG. 12 is a schematic diagram of a display panel provided by an embodiment of the present disclosure. The structure of the display panel shown in FIG. 12 is the same as the structure of the display panel shown in FIG. 2, except that: the breakpoint A shown in FIG. 2 is in the display region R1 and the breakpoint A shown in FIG. 12 is in the fan-out region FR. As shown in FIG. 12, in the case where there exists a breakpoint A in the fan-out region FR, the point C can be welded, and the same signal is supplied to the first pin P1 and the data transmission line Dx through the integrated circuit IC, so that the first repair line RL1 can repair the whole column of pixel units, and then repair the defect of breakage. That is, in the case where the data transmission line DTL has a breakpoint in the fan-out region FR, the overlapping position between the data transmission line DTL and the first repair line RL1 overlapped with the data transmission line DTL is welded, thereby repairing the defect of breakage. For example, as shown in FIG. 12, when there exists a breakpoint A in the fan-out region FR, point C, point B1 and point B2 can also be welded, and the same signal is supplied to the first pin P1 and the data transmission line Dx through the integrated circuit IC, so that the first repair line RL1 can repair the whole column of pixel units, and then repair the defect of breakage. That is, in the case where the data transmission line DTL has a breakpoint in the fan-out region FR, the overlapping position between the data transmission line DTL and the first repair line RL1 overlapped with the data transmission line DTL is welded, and the overlapping positions between the two data lines DL connected with the data transmission line DTL and the two second repair lines RL2 overlapped with the two data lines DL are welded, thereby repairing the defect of breakage. As shown in FIG. 12, each repair structure RS can repair one breakpoint located in the fan-out region FR, that is, the first repair structure RS1 can repair one breakpoint located in the fan-out region FR, and the second repair structure RS2 can repair one breakpoint located in the fan-out region FR. The two repair structures RS shown in FIG. 12 can repair one breakpoint located in the fan-out region FR.

Figure 13:
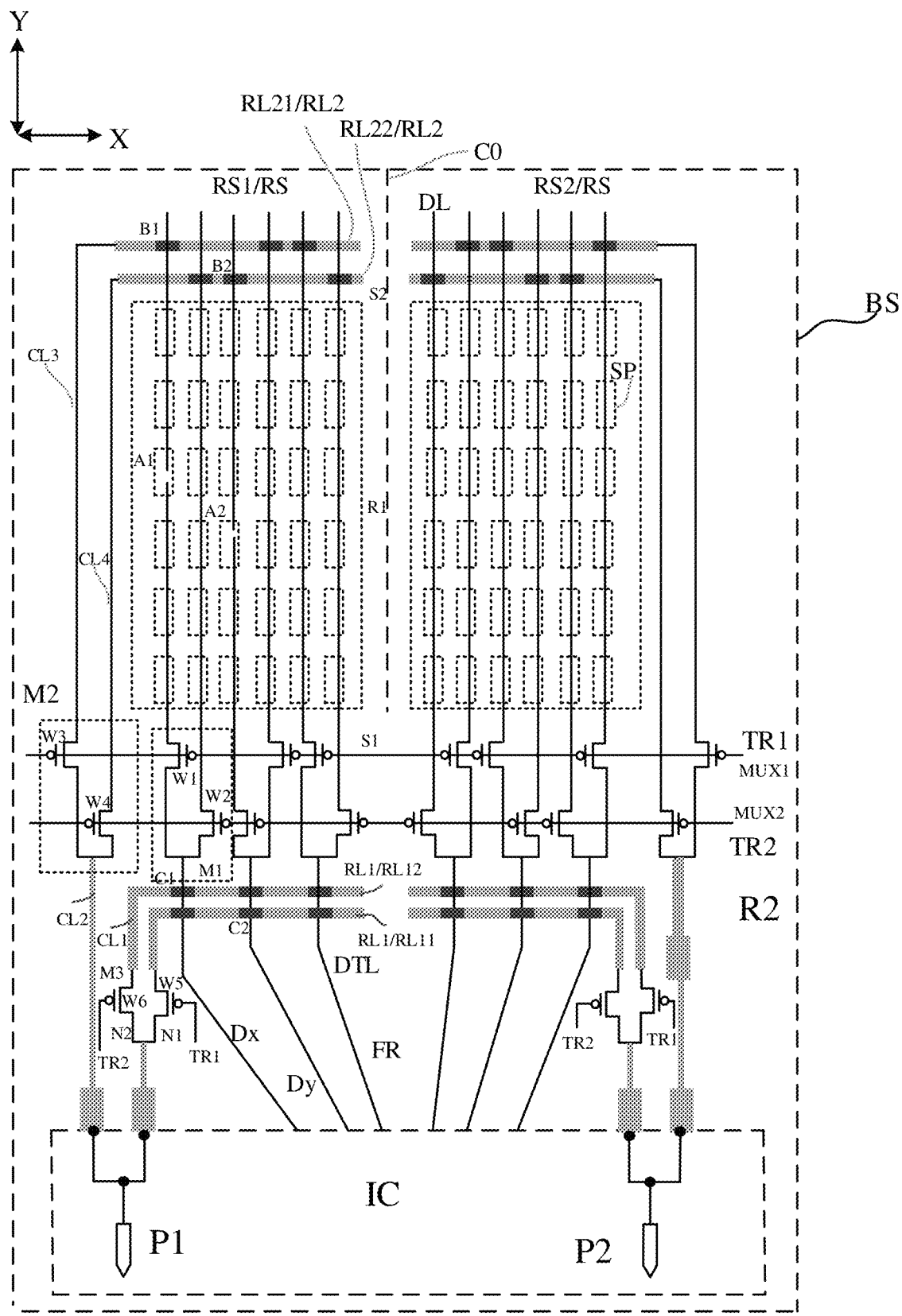
FIG. 13 is a schematic diagram of a display panel provided by an embodiment of the present disclosure.

FIG. 13 is a schematic diagram of a display panel provided by an embodiment of the present disclosure. For example, as shown in FIG. 13, the display panel further includes a third data multiplexer M3, and the display panel includes two first repair lines RL1 which are connected with the integrated circuit IC through the third data multiplexer M3. For example, as shown in FIG. 13, the two first repair lines RL1 include a first repair line RL11 and a first repair line RL12. The third data multiplexer M3 includes a fifth switching unit W5 and a sixth switching unit W6. The first repair line RL11 is connected with the integrated circuit IC through the fifth switching unit W5, and the first repair line RL12 is connected with the integrated circuit IC through the sixth switching unit W6. The fifth switching unit W5 includes a transistor, and the sixth switching unit W6 includes a transistor, but the embodiment is not limited to this case.

Referring to FIG. 2, FIG. 12 and FIG. 13, the display panel is axisymmetric with respect to the center line C0. The first repair structure RS1 on the left side of the center line C0 and the second repair structure RS2 on the right side of the center line C0 are axisymmetric with respect to the center line C0. The second repair structure RS2 is short-circuited at the second pin P2 in the integrated circuit IC. For example, different signal can be input to the first pin P1 and the second pin P2, respectively.

Referring to FIG. 2, FIG. 12 and FIG. 13, the first repair line RL1 of the first repair structure RS1 and the first repair line RL1 of the second repair structure RS2 are spaced apart from each other in the first direction X, and the second repair line RL2 of the first repair structure RS1 and the second repair line RL2 of the second repair structure RS2 are spaced apart from each other in the first direction X, so that the display panel has two relatively independent repair structures, so as to repair breakpoints on the display panel as much as possible.

As shown in FIG. 13, in the case where there are two breakpoints A1 and A2 in the display region R1 at the same time, point B1, point B2, point C1 and point C2 can also be welded, and two kinds of signals are supplied through the integrated circuit IC, so that in terms of the repair structure located on the left side of the display panel, the signal on the first pin P1 is the same as the signal on the data transmission line Dx when a turn-on signal is input to the first control line TR1, and the signal on the first pin P1 is the same as the signal on the data transmission line Dy when a turn-on signal is input to the second control line TR2. As shown in FIG. 13, the first repair structure RS1 located on the left side of the display panel can repair at most two breakpoints in the display region, and the second repair structure RS2 located on the right side of the display panel can repair at most two breakpoints in the display region. That is, in terms of the structure shown in FIG. 13, up to four breakpoints in the display region can be repaired.

Figure 14:
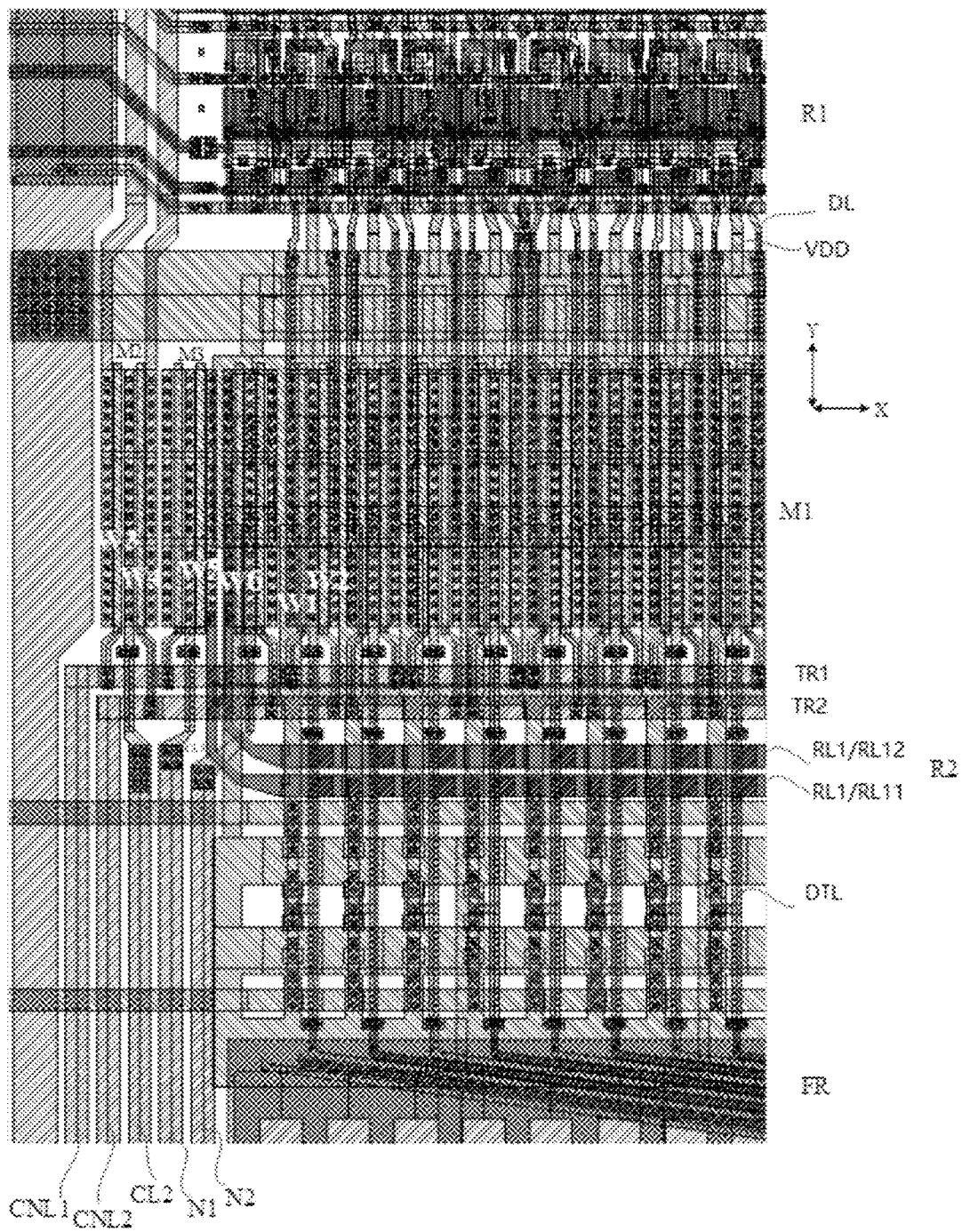
FIG. 14 is a partial layout diagram of a display panel provided by an embodiment of the present disclosure.

FIG. 14 is a plan view of a display panel provided by an embodiment of the present disclosure. For example, as shown in FIG. 13 and FIG. 14, the third data multiplexer M3 and the plurality of first data multiplexers M1 are located at a same side of the plurality of pixel units SP, which is beneficial to manufacture the third data multiplexer M3 and makes the display panel compact in structure. Because the third data multiplexer M3 and the plurality of first data multiplexers M1 are located at the same side of the plurality of pixel units SP, the arrangement of control lines of the data multiplexers is facilitated, the routing is simple, and the bezel of the display panel is facilitated to be reduced.

For example, as shown in FIG. 13 and FIG. 14, the third data multiplexer M3, the second data multiplexer M2 and the plurality of first data multiplexers M1 are located at the same side of the plurality of pixel units SP, which is beneficial to manufacture the third data multiplexer M3 and makes the display panel compact in structure. Because the third data multiplexer M3, the second data multiplexer M2 and the plurality of first data multiplexers M1 are located at the same side of the plurality of pixel units SP, the arrangement of control lines of the data multiplexers is facilitated, the routing is simple, and the bezel of the display panel is facilitated to be reduced.

For example, as shown in FIG. 13 and FIG. 14, the third data multiplexer M3 and the plurality of first data multiplexers M1 share a same first control line TR1 and a same second control line TR2. For example, as shown in FIG. 13 and FIG. 14, the fifth switching unit W5 and the first switching units W1 of the plurality of first data multiplexers M1 share the same first control line TR1, and the sixth switching unit W6 and the second switching units W2 of the plurality of first data multiplexers M1 share the same second control line TR2.

For example, as shown in FIG. 14, the data transmission line DTL has two first protruding portions PR1, the two first protruding portions PR1 are respectively overlapped with two first repair lines RL1, and the two first protruding portions PR1 are located at a same side of the data transmission line DTL.

For example, as shown in FIG. 14, the third data multiplexer M3 includes a first signal line N1 and a second signal line N2, the first signal line N1 and the second signal line N2 are signal output terminals of the third data multiplexer M3, and two first repair lines RL1 are signal input terminals of the third data multiplexer M3. That is, the signal input terminal of the fifth switching unit W5 is the first repair line RL11, and the signal output terminal of the fifth switching unit W5 is the first signal line N1; the signal input terminal of the sixth switching unit W6 is the first repair line RL12, and the signal output terminal of the sixth switching unit W6 is the second signal line N2.

For example, as shown in FIG. 14, one of the first signal line N1 and the second signal line N2 is overlapped with two first repair lines RL1. FIG. 14 is illustrated by taking the case where the second signal line N2 is overlapped with the two first repair lines RL1 as an example. For example, as shown in FIG. 14, two first repair lines RL1 are connected with the third data multiplexer M3 through two first connection lines CL1, respectively, and the second signal line N2 is overlapped with the two first connection lines CL1.

For example, as shown in FIG. 14, the first signal line N1 is not overlapped with the two first repair lines RL1.

For example, as shown in FIG. 14, the first repair line RL12 connected with the second signal line N2 is closer to the display region R1 than the first repair line RL11 connected with the first signal line N1.

For example, as shown in FIG. 14, the second data multiplexer M2, the third data multiplexer M3 and the plurality of first data multiplexers M1 are sequentially arranged along the first direction X.

For example, as shown in FIG. 14, the third switching unit W3, the fourth switching unit W4, the fifth switching unit W5, the sixth switching unit W6, the first switching unit W1 and the second switching unit W2 are sequentially arranged along the first direction X.

For example, the first signal line N1, the second signal line N2, and the second connection line CL2 are all connected with the integrated circuit IC. For example, the first signal line N1, the second signal line N2 and the second connection line CL2 are all connected with the same first pin P1 of the integrated circuit IC. In other words, the first signal line N1, the second signal line N2 and the second connection line CL2 are all connected inside the integrated circuit IC.

For example, referring to FIG. 11 and FIG. 14, the first repair line RL1 extends along the first direction X, and the size, in the first direction X, of a portion of the data transmission line DTL overlapped with the first repair line RL1 is greater than the size, in the first direction X, of a portion of the data transmission line DTL not overlapped with the first repair line RL1. The size of the data transmission line DTL becomes larger at the overlapping position, which is beneficial to the welding process.

Of course, in the display panel shown in FIG. 13 and FIG. 14, more first repair lines RL1 can also be included. That is, the display panel includes a plurality of first repair lines RL1.

For example, the plurality of first repair lines RL1 are located in the peripheral region R2 and at one side of the third data multiplexer M3 away from the display region R1. As shown in FIG. 14, two first repair lines RL1 are located in the peripheral region R2 and at the side of the third data multiplexer M3 away from the display region R1.

FIG. 14 takes the case where one data transmission line DTL corresponds to two data lines DL, and the first data multiplexer M1, the second data multiplexer M2, and the third data multiplexer M3 each include two switching units as an example, but the embodiment of the present disclosure is not limited to this case. For example, in other embodiments, one data transmission line DTL may correspond to three data lines DL, and the first data multiplexer M1, the second data multiplexer M2, and the third data multiplexer M3 each include three switching units. That is, one data transmission line DTL may correspond to N data lines DL, and the first data multiplexer M1, the second data multiplexer M2 and the third data multiplexer M3 each include N switching units. For example, N is an integer greater than or equal to 2. For example, N is greater than or equal to 2 and less than or equal to 6, but the embodiment is not limited to this case; and N can also be greater than 6, which can be selected according to actual conditions. For example, in this case, the display panel includes N control lines. For example, in this case, the display panel includes N first repair lines RL1 and N second repair lines RL2. For example, in this case, the display panel includes N first protruding portions PR1 and N protruding portions PR2.

For example, the number of switching units included in the first data multiplexer M1, the number of switching units included in the second data multiplexer M2 and the number of switching units included in the third data multiplexer M3 are all the same.

For example, the number of control lines is equal to the number of switching units. The embodiment of the present disclosure are illustrated by taking the case where the first data multiplexer M1 includes two switching units, the second data multiplexer M2 includes two switching units, the third data multiplexer M3 includes two switching units, and the display panel includes two control lines, i.e., a first control line and a second control line, as an example.

For example, in the case where one data transmission line DTL corresponds to N data lines DL, data signals can be input to these N data lines DL through the data transmission line DTL in N time periods, respectively.

FIG. 15 to FIG. 22 are plan views of some film layers of the display panel shown in FIG. 14. The following description will be made with reference to FIG. 14 to FIG. 22.

Figure 15:
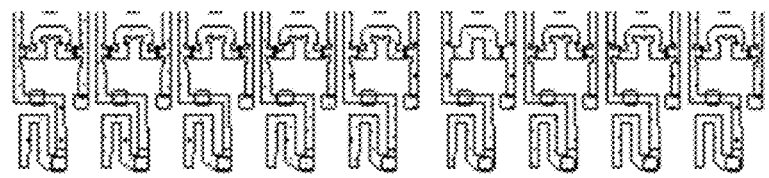
FIG. 15 to FIG. 22 are plan views of some film layers of the display panel shown in FIG. 14.
Figure 15:
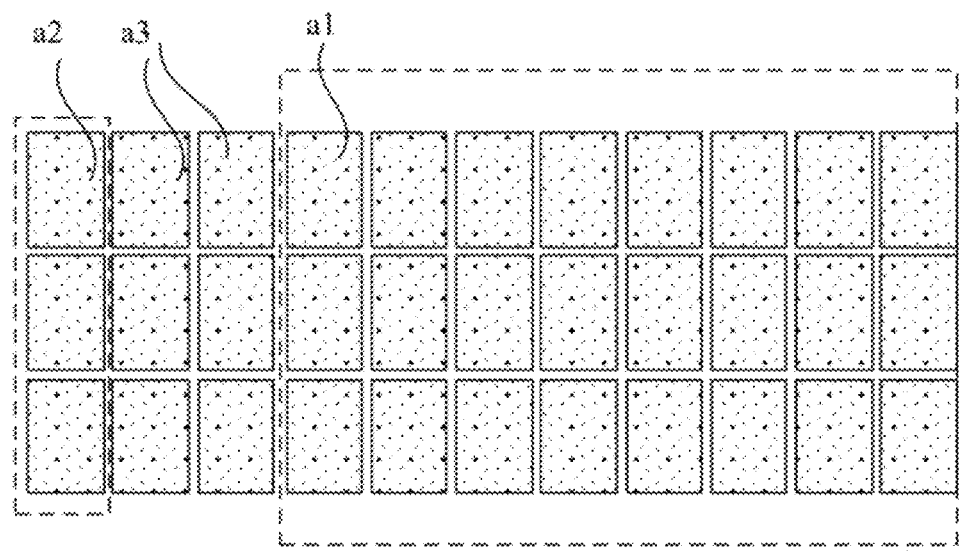
Figure 15:
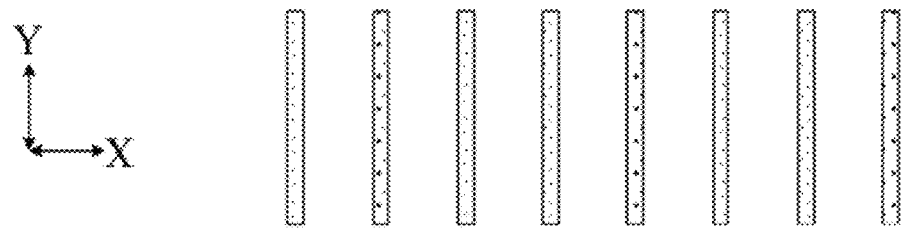

FIG. 15 is a plan view of an active layer pattern in the display panel shown in FIG. 14. As shown in FIG. 15, the active layer pattern SCP includes a semiconductor active layer a1 of the first data multiplexer M1, a semiconductor active layer a2 of the second data multiplexer M2, and a semiconductor active layer a3 of the third data multiplexer M3. For example, different parts of the semiconductor active layer a1 serve as active layers of the first transistor and the second transistor, respectively; different parts of the semiconductor active layer a2 serve as active layers of the third transistor and the fourth transistor, respectively; and different parts of the semiconductor active layer a3 serve as active layers of the fifth transistor and the sixth transistor, respectively.

Figure 16:
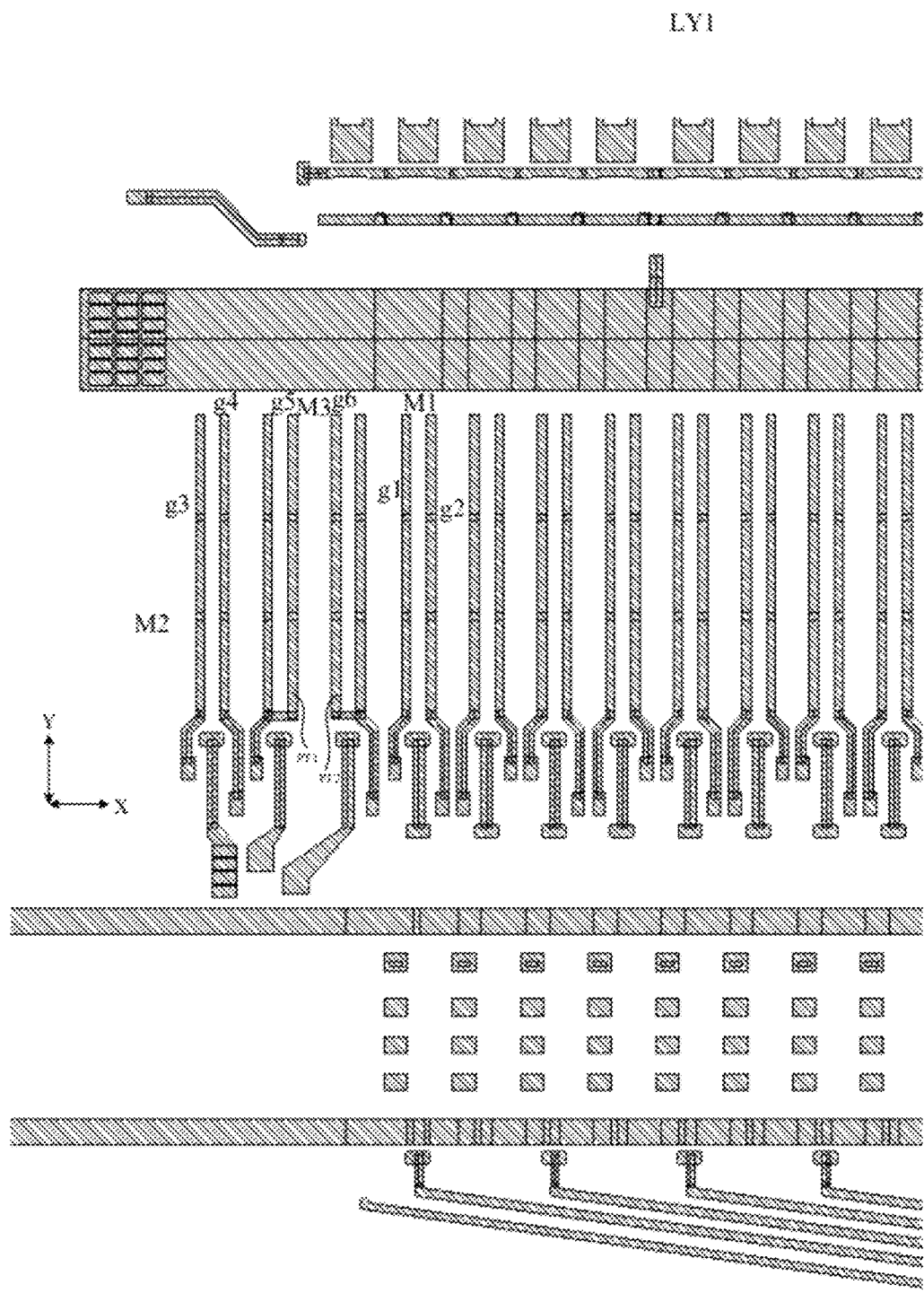

FIG. 16 is a plan view of a first conductive pattern in the display panel shown in FIG. 14. As shown in FIG. 16, the first conductive pattern LY1 includes a first gate electrode g1 of the first transistor, a second gate electrode g2 of the second transistor, a third gate electrode g3 of the third transistor, a fourth gate electrode g4 of the fourth transistor, a fifth gate electrode g5 of the fifth transistor and a sixth gate electrode g6 of the sixth transistor.

As shown in FIG. 16, the fifth gate electrode g5 of the fifth transistor includes two first sub-portions PT1 extending along the second direction Y, and the two first sub-portions PT1 are short-circuited; the sixth gate electrode g6 of the sixth transistor includes two second sub-portions PT2 extending along the second direction, and the two second sub-portions PT2 are short-circuited.

Figure 17:
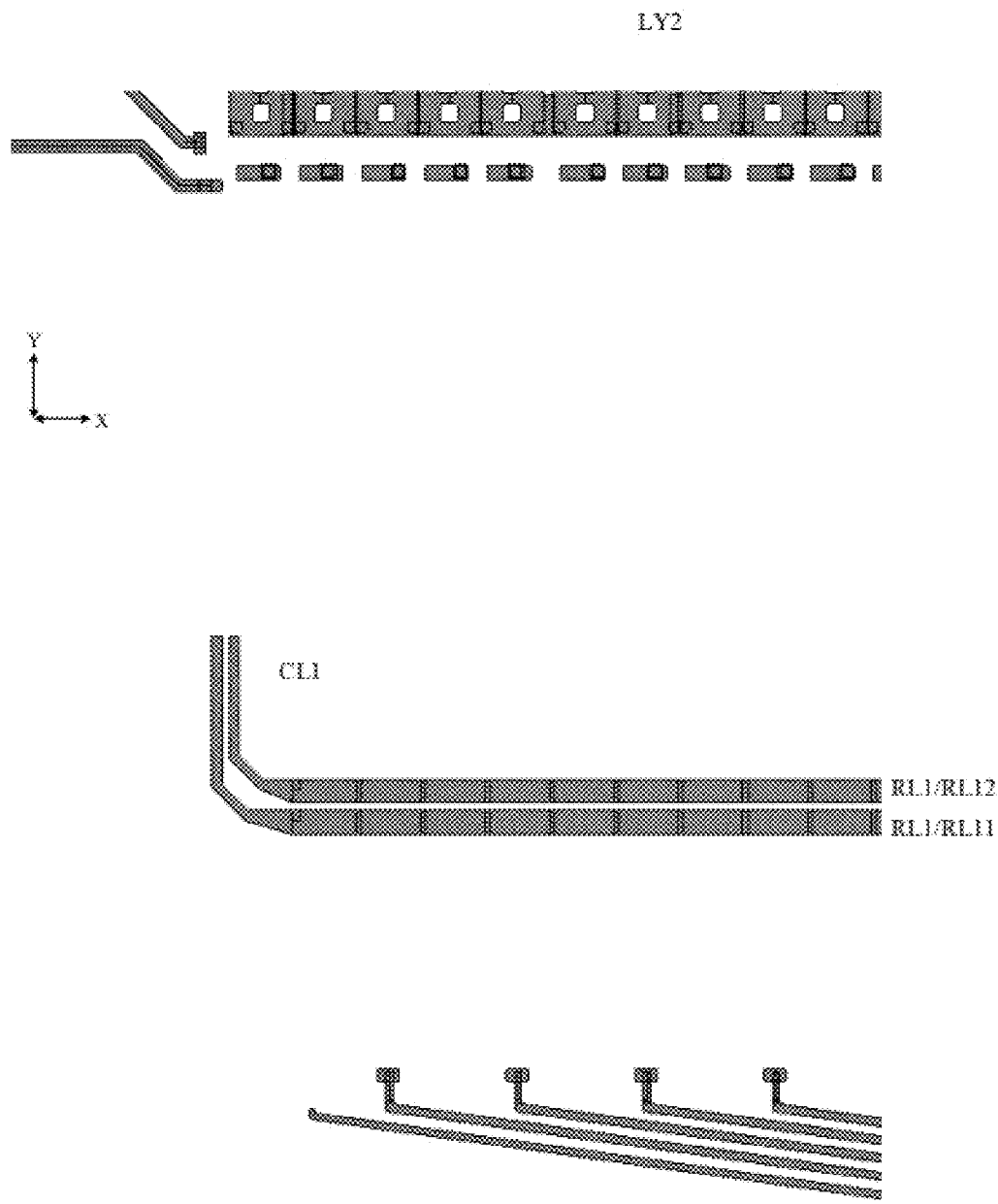
Figure 18:
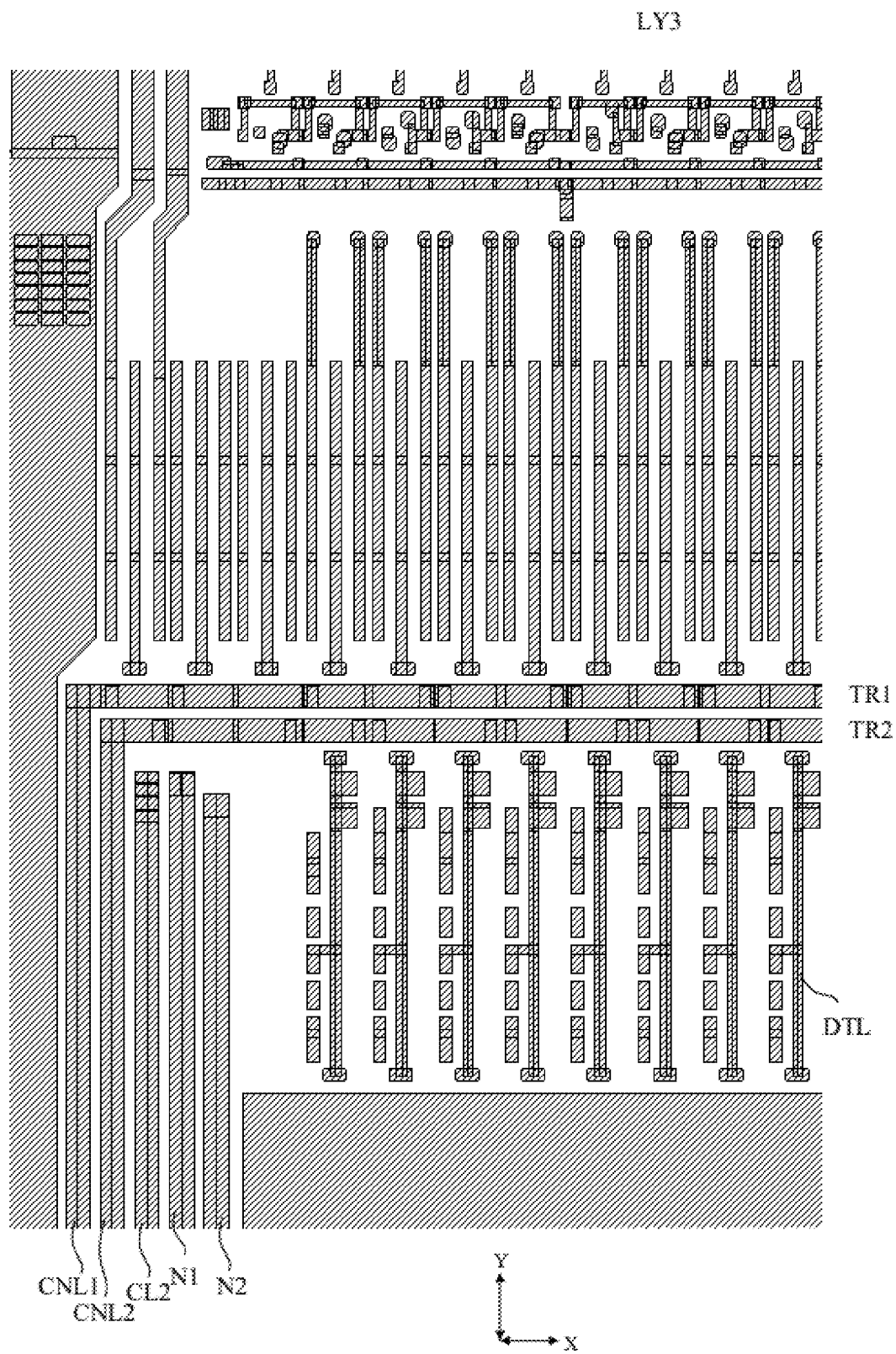

FIG. 17 is a plan view of a second conductive pattern in the display panel shown in FIG. 14. The second conductive pattern LY2 includes two first repair lines RL1. Each first repair line RL1 is connected with one first connection line CL1. For example, as shown in FIG. 14, the first connection line CL1 can be used as a part of the first repair line RL11, and the second connection line CL2 can be used as a part of the first repair line RL12. In other words, the first connection line CL1 and the first repair line RL11 are formed as one integral structure, and the second connection line CL2 and the first repair line RL12 are formed as one integral structure.

Figure 19:
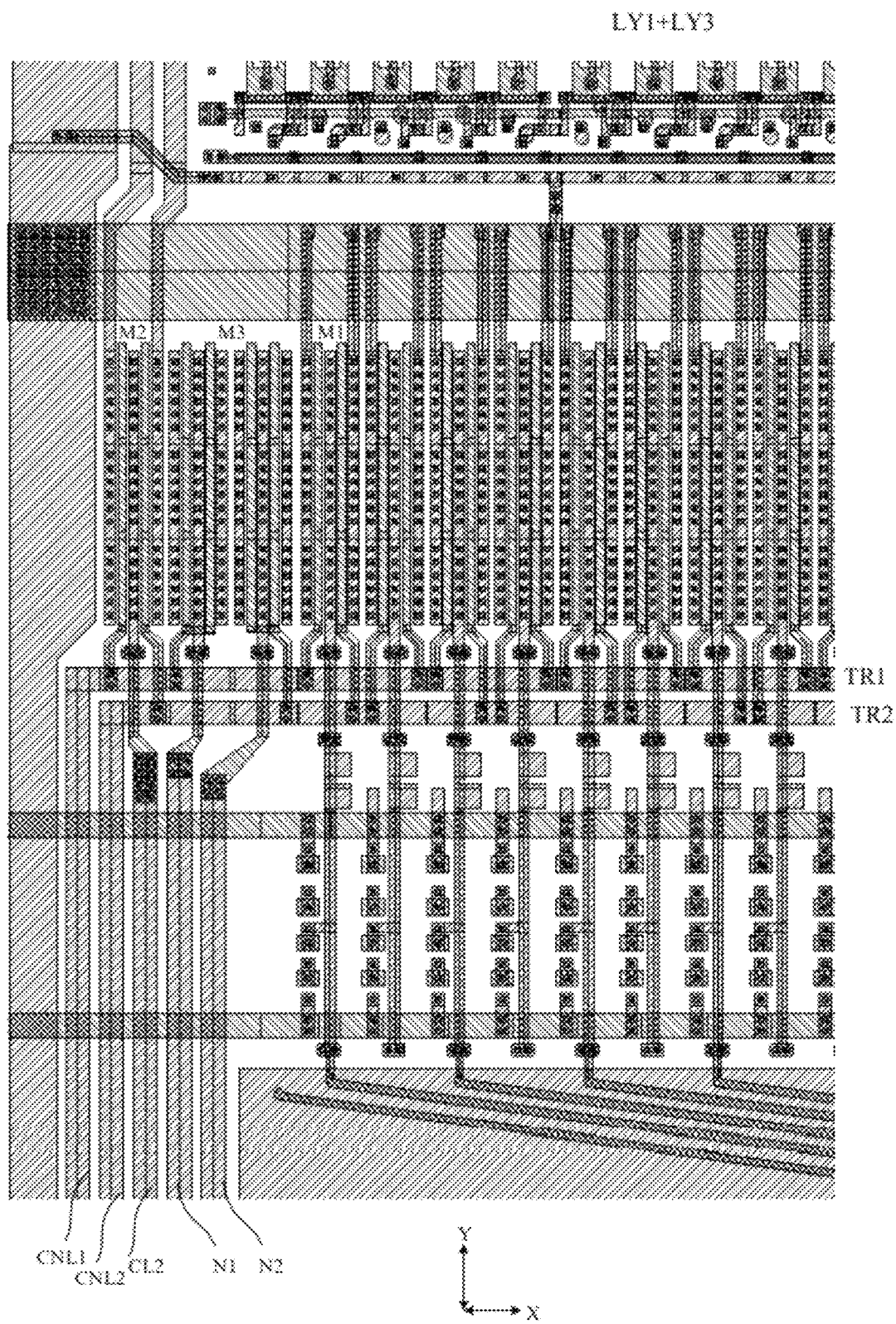

FIG. 19 is a plan view of the first conductive pattern and the third conductive pattern in the display panel shown in FIG. 14. FIG. 19 shows a first control line TR1, a second control line TR2, a connection line CNL1, a connection line CNL2, a second connection line CL2, a first signal line N1 and a second signal line N2. Referring to FIG. 16 and FIG. 19, the first gate electrode g1 of the first transistor, the third gate electrode g3 of the third transistor, and the fifth gate electrode g5 of the fifth transistor are all connected with the first control line TR1, that is, the first transistor, the third transistor, and the fifth transistor share the same first control line TR1; the second gate electrode g2 of the second transistor, the fourth gate electrode g4 of the fourth transistor and the sixth gate electrode g6 of the sixth transistor are all connected with the second control line TR2, that is, the second transistor, the fourth transistor and the sixth transistor share the same second control line TR2.

Figure 20:
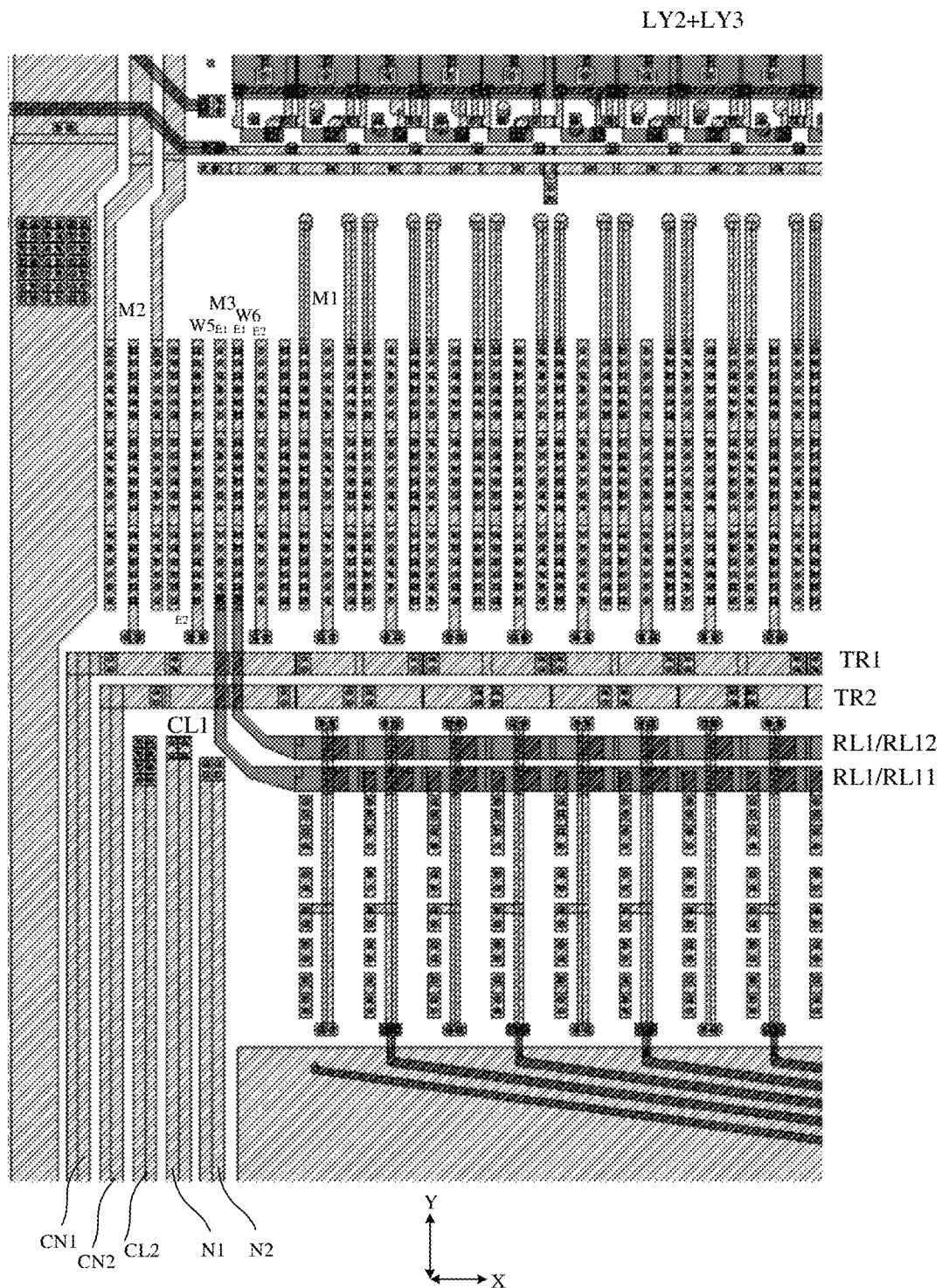

FIG. 20 is a plan view of the second conductive pattern and the third conductive pattern in the display panel shown in FIG. 14. As shown in FIG. 20, the first repair line RL1 is connected with the third data multiplexer M3 through the first connection line CL1. As shown in FIG. 20, the first repair line RL11 serves as a signal input terminal of the fifth switching unit W5, and the first repair line RL12 serves as a signal input terminal of the sixth switching unit W6.

Figure 21:
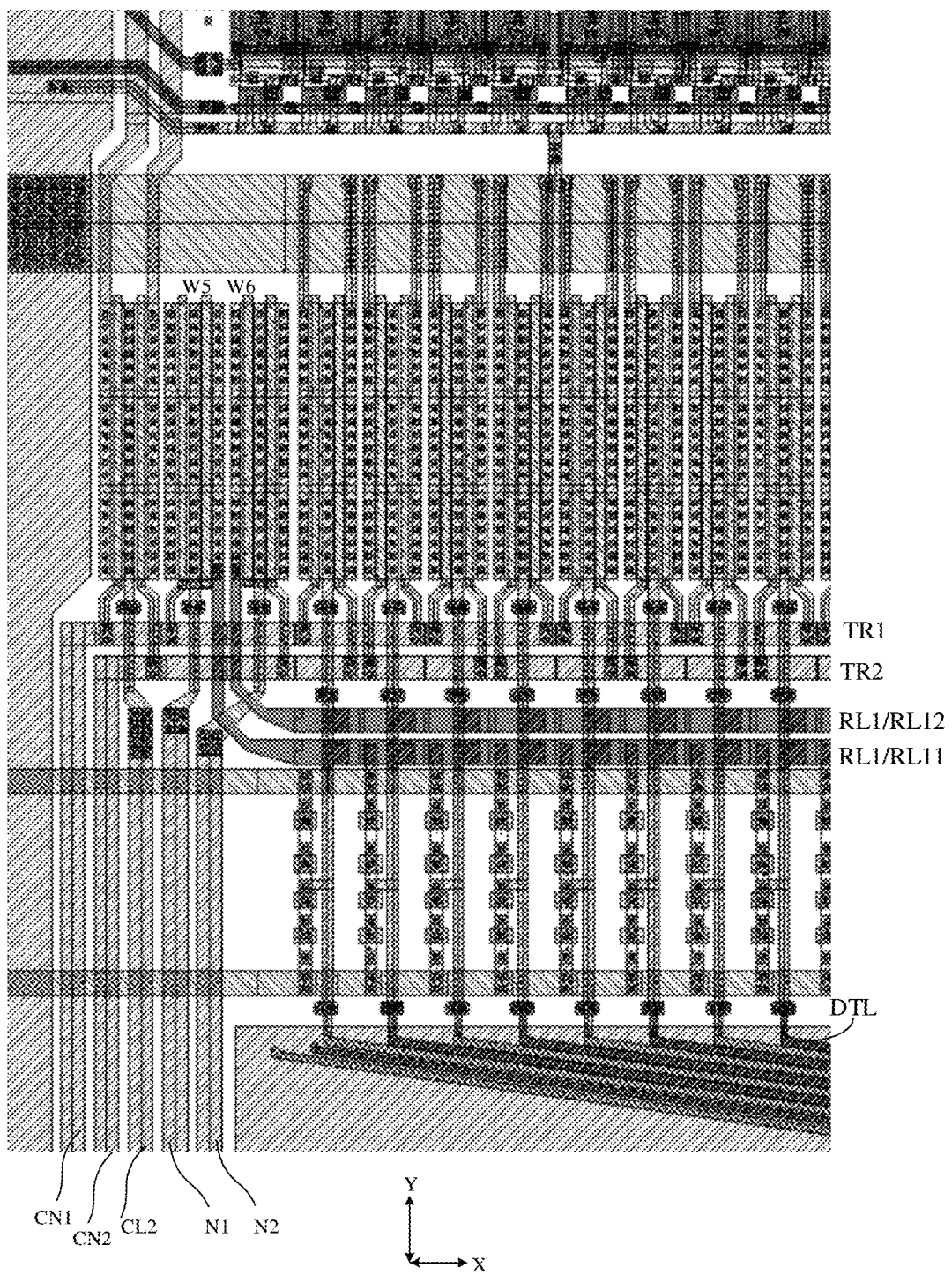

FIG. 21 is a plan view of the active layer pattern, the first conductive pattern, the second conductive pattern and the third conductive pattern in the display panel shown in FIG. 14. As shown in FIG. 21, the first signal line N1 is a signal output terminal of the fifth switching unit W5, and the second signal line N2 is a signal output terminal of the sixth switching unit W6.

Referring to FIG. 16, FIG. 20 and FIG. 21, one of the two first sub-portions PT1 is located between the first electrode E1 of the fifth transistor and the second electrode E2 of the fifth transistor, and the other one of the two first sub-portions PT1 is located at one side of the second electrode E2 of the fifth transistor away from the first electrode E1 of the fifth transistor.

Referring to FIG. 16, FIG. 20 and FIG. 21, one of the two second sub-portions PT2 is located between the first electrode E1 of the sixth transistor and the second electrode E2 of the sixth transistor, and the other one of the two second sub-portions PT2 is located at one side of the second electrode E2 of the sixth transistor away from the first electrode E1 of the sixth transistor.

As shown in FIG. 20, the second electrode E2 of the fifth transistor, the first electrode E1 of the fifth transistor, the first electrode E1 of the sixth transistor and the second electrode E2 of the sixth transistor are sequentially arranged along the first direction.

As shown in FIG. 21, the first signal line N1 is connected with the second electrode E2 of the fifth transistor, and the first signal line N1 is overlapped with the gate electrode g5 of the fifth transistor.

As shown in FIG. 21, the second signal line N2 is connected with the second electrode E2 of the sixth transistor, and the second signal line N1 is overlapped with the gate electrode g6 of the sixth transistor.

As shown in FIG. 21, the first repair line RL11 is connected with the first electrode E1 of the fifth transistor through a first connection line CL1, and the first repair line RL12 is connected with the first electrode E1 of the sixth transistor through another first connection line CL1.

Figure 22:
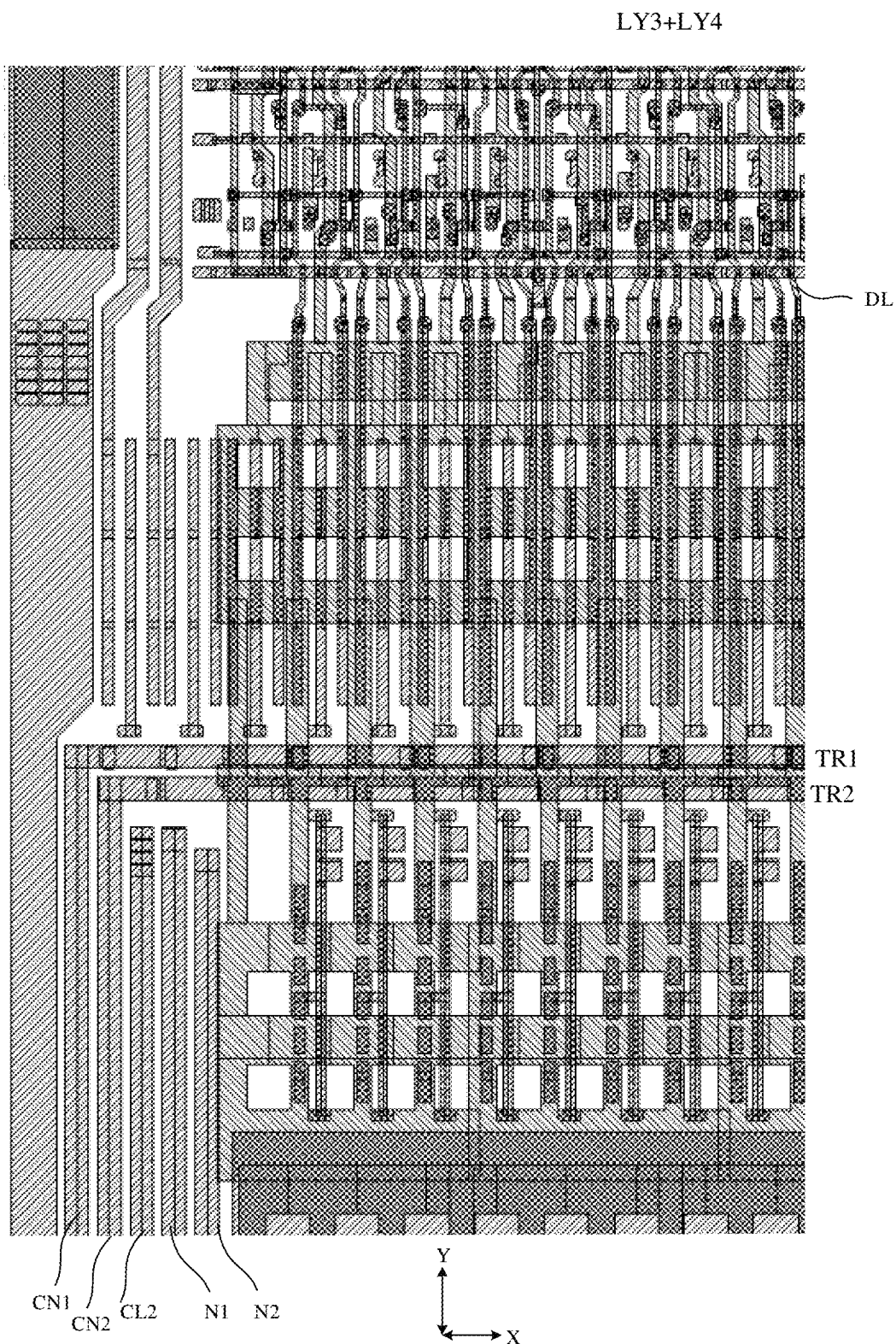

FIG. 22 is a plan view of the third conductive pattern LY3 and the fourth conductive pattern LY4 in the display panel shown in FIG. 14. FIG. 22 shows signal lines, such as data lines DL, etc.

Figure 23:
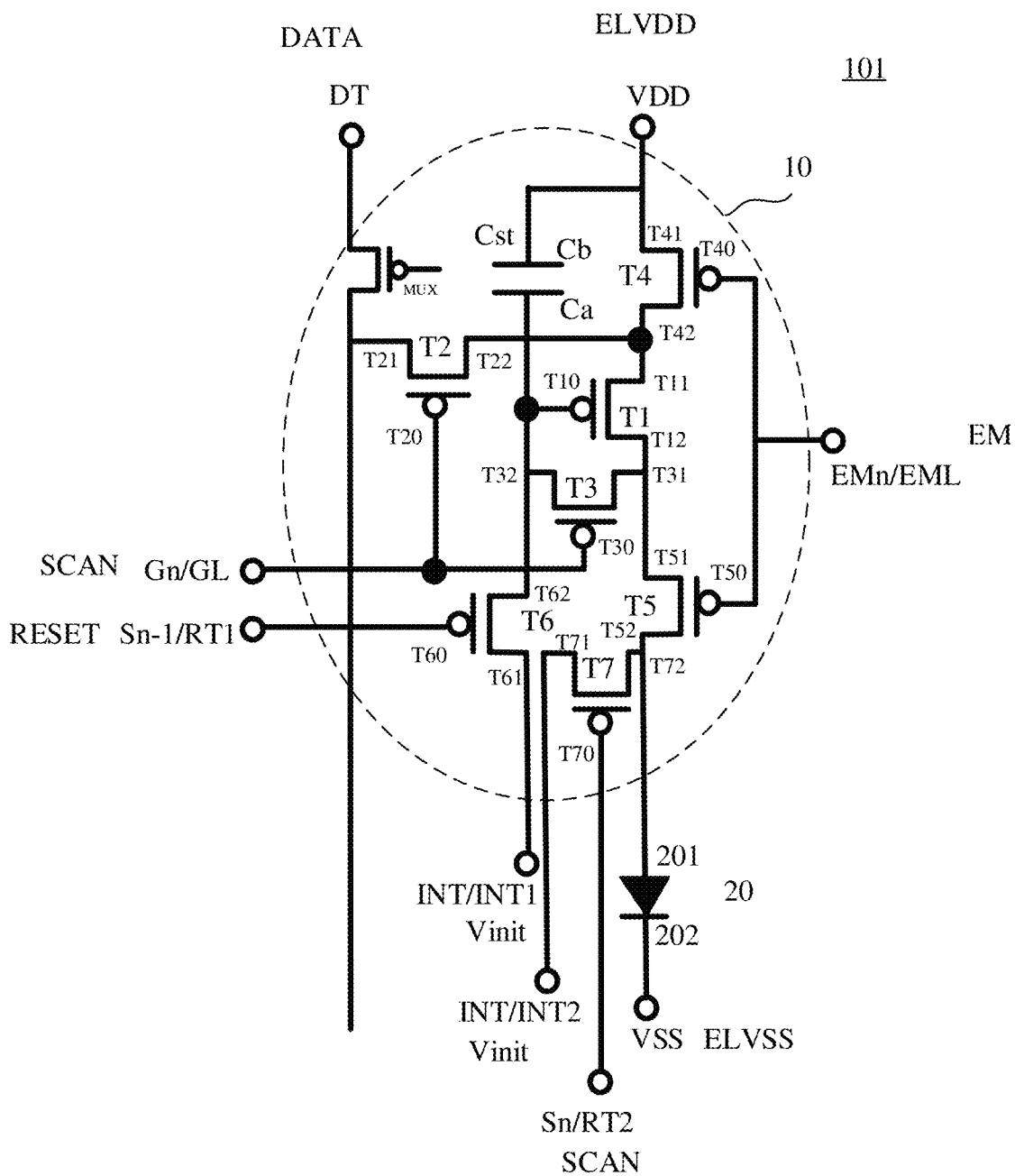
FIG. 23 is a schematic diagram of a 7T1C pixel circuit.
Figure 24:
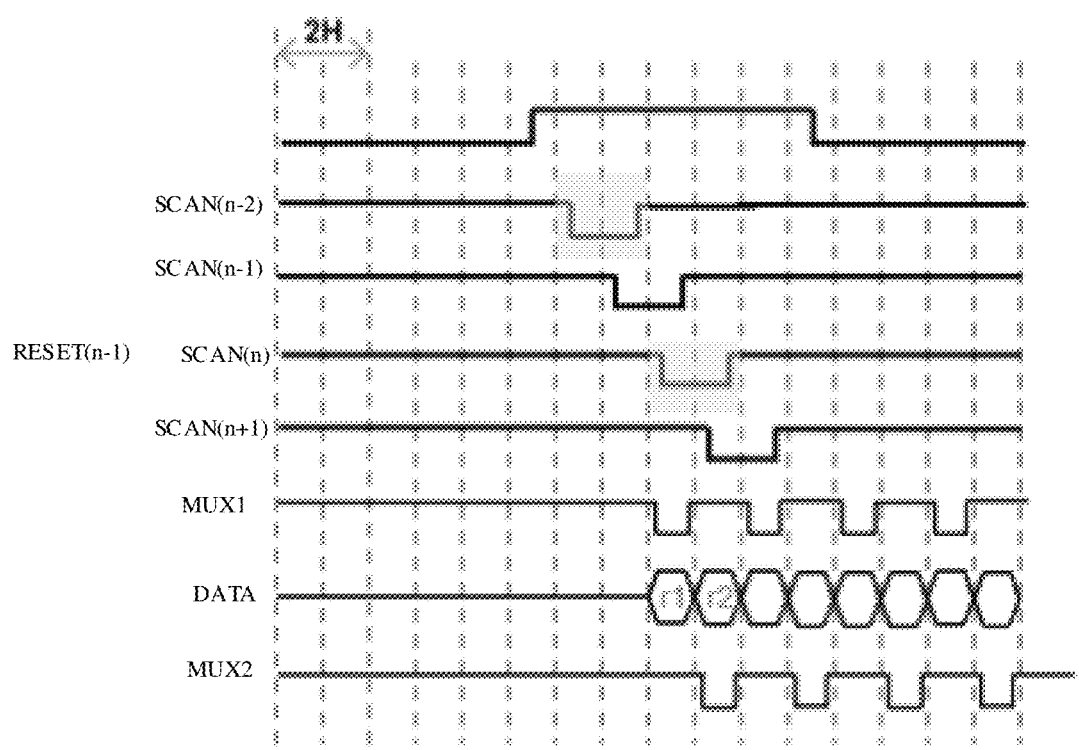
FIG. 24 is a working sequence diagram of the pixel circuit shown in FIG. 23.
Figure 25:
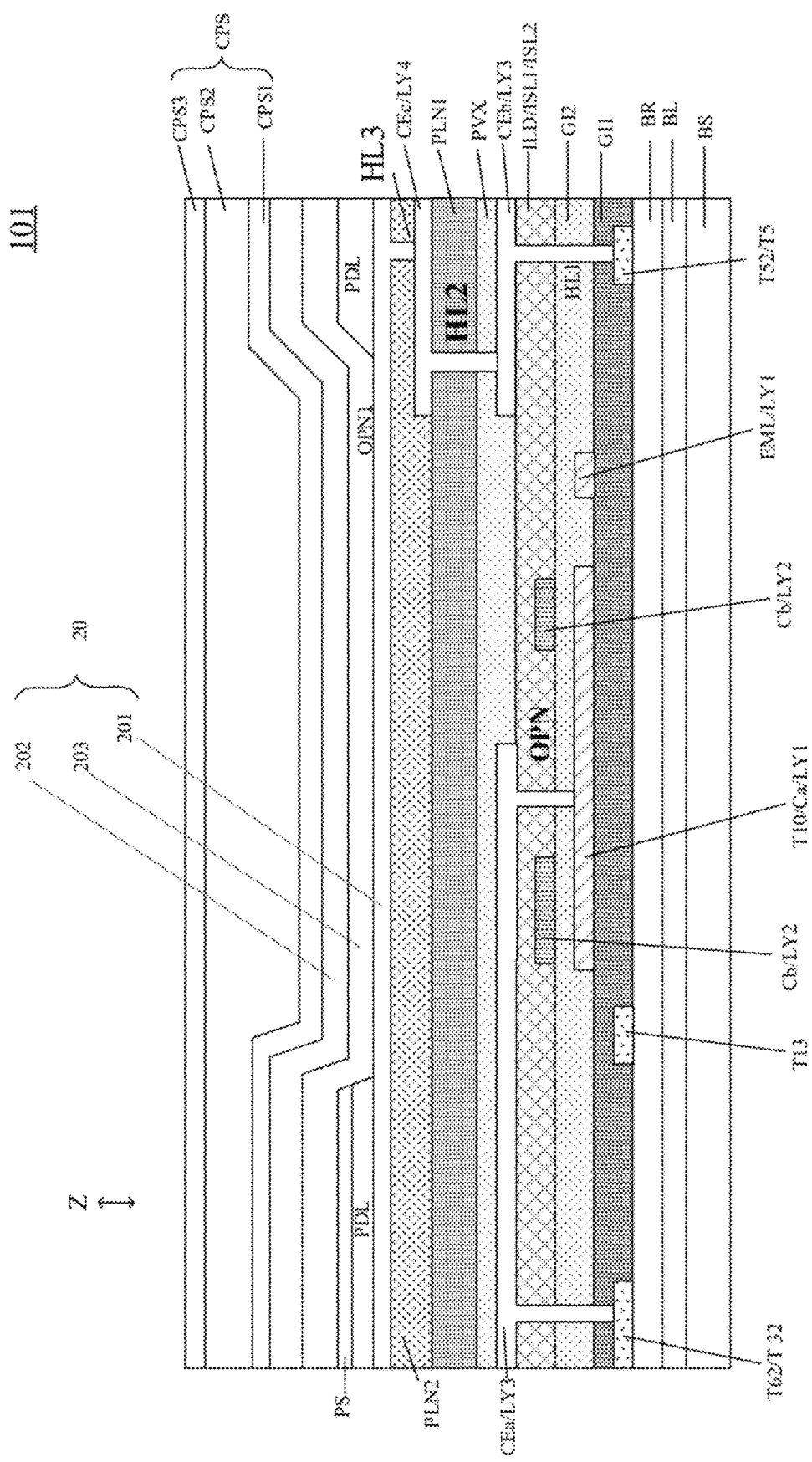
FIG. 25 is a cross-sectional view of a display panel provided by an embodiment of the present disclosure.

FIG. 23 is a schematic diagram of a 7T1C pixel circuit; FIG. 24 is a working sequence diagram of the pixel circuit shown in FIG. 23; FIG. 25 is a cross-sectional view of a display panel provided by an embodiment of the present disclosure. FIG. 25 can be a cross-sectional view at the connection electrode CEa in FIG. 4.

For example, referring to FIG. 7, FIG. 10A, FIG. 17, FIG. 18, FIG. 20 and FIG. 25, a first insulating layer ISL1 is disposed between the first repair line RL1 (located in the second conductive layer LY2) and the plurality of data transmission lines DTL (located in the third conductive layer LY3), and a second insulating layer ISL2 is disposed between the two second repair lines RL2 (located in the second conductive layer LY2) and the plurality of data lines DL (located in the third conductive layer LY3). The embodiment of the present disclosure is illustrated by taking the case where the insulating layer ISL1 and the insulating layer ISL2 are interlayer insulating layers ILD as an example. In other embodiments, the insulating layer ISL1 and the insulating layer ISL2 can be at least one of the second gate insulating layer GI2 and the interlayer insulating layer ILD, respectively. For example, taking the first repair line RL1 and the plurality of data transmission lines DTL as an example, in the case where the first repair line RL1 is located in the first conductive layer LY1 and the plurality of data transmission lines DTL are located in the third conductive layer LY3, the insulating layer ISL1 is the second gate insulating layer GI2 and the interlayer insulating layer ILD; and in the case where the first repair line RL1 is located in the first conductive layer LY1 and the plurality of data transmission lines DTL are located in the second conductive layer LY2, the insulating layer ISL1 is the second gate insulating layer GI2. The embodiment of the present disclosure is illustrated by taking the case where the insulating layer ISL1 and the insulating layer ISL2 are the same insulating layer as an example, but is not limited to this case. In other embodiments, the insulating layer ISL1 and the insulating layer ISL2 can be different.

Referring to FIG. 23, the pixel circuit shown in FIG. 23 can be a pixel circuit of a low temperature poly-silicon (LTPS) AMOLED commonly used in related art. FIG. 24 is a working sequence diagram of the pixel circuit shown in FIG. 23.

FIG. 23 shows the pixel circuit of one pixel unit of the display panel. As shown in FIG. 23, the pixel unit 101 includes a pixel circuit 10 and a light-emitting element 20. The pixel circuit 10 includes six switching transistors (T2-T7), one driving transistor T1 and one storage capacitor Cst. The six switching transistors are a data writing transistor T2, a threshold compensation transistor T3, a first light-emitting control transistor T4, a second light-emitting control transistor T5, a first reset transistor T6, and a second reset transistor T7. The light-emitting element 20 includes a first electrode 201, a second electrode 202, and a light-emitting functional layer 203 located between the first electrode 201 and the second electrode 202. For example, the first electrode 201 is an anode and the second electrode 202 is a cathode. Generally, the threshold compensation transistor T3 and the first reset transistor T6 adopt a dual-gate TFT to reduce leakage.

As shown in FIG. 23, the display panel includes a gate line GL, a data line DL, a first power terminal VDD, a second power terminal VSS, a light-emitting control signal line EML, an initialization signal line INT (a first initialization signal line INT1, a second initialization signal line INT2), a first reset control signal line RT1, a second reset control signal line RT2, etc. The first power terminal VDD is configured to provide a constant first voltage signal ELVDD to the pixel unit 101, the second power terminal VSS is configured to provide a constant second voltage signal ELVSS to the pixel unit 101, and the first voltage signal ELVDD is higher than the second voltage signal ELVSS. The gate line GL is configured to provide a scanning signal SCAN to the pixel unit 101, the data line DL is configured to provide a data signal DATA (data voltage VDATA) to the pixel unit 101, the light-emitting control signal line EML is configured to provide a light-emitting control signal EM to the pixel unit 101, the first reset control signal line RT1 is configured to provide a reset control signal RESET to the pixel unit 101, the second reset control signal line RT1 is configured to provide a scanning signal SCAN to the pixel unit 101, and the initialization signal line INT is configured to provide an initialization signal Vinit to the pixel unit 101. For example, the initialization signal Vinit is a constant voltage signal, and the magnitude thereof can be between the magnitude of the first voltage signal ELVDD and the magnitude of the second voltage signal ELVSS, but is not limited thereto. For example, the initialization signal Vinit can be less than or equal to the second voltage signal ELVSS. For example, the initialization signal line INT includes a first initialization signal line INT1 and a second initialization signal line INT2. For example, the first initialization signal line INT1 is configured to provide an initialization signal Vinit1 to the pixel unit 101, and the second initialization signal line INT1 is configured to provide an initialization signal Vinit2 to the pixel unit 101. For example, in some embodiments, the first initialization signal Vinit1 and the second initialization signal Vinit2 are the same and both are Vinit.

For example, the first control line TR1 is configured to provide a first control signal MUX1 to the pixel unit 101, and the second control line TR2 is configured to provide a second control signal MUX2 to the pixel unit 101. The first control signal MUX1 and the second control signal MUX2 can be referred to as control signals MUX. The first control signal MUX1 causes the output terminal of the switching unit connected thereto to output a signal, and the second control signal MUX2 causes the output terminal of the switching unit connected thereto to output a signal. Referring to FIG. 2 and FIG. 12, the first control signal MUX1 causes the output terminals of the first switching unit W1 and the third switching unit W3 to output signals, and the second control signal MUX2 causes the output terminals of the second switching unit W2 and the fourth switching unit W4 to output signals. Referring to FIG. 13, the first control signal MUX1 causes the output terminals of the first switching unit W1, the third switching unit W3 and the fifth switching unit W5 to output signals, and the second control signal MUX2 causes the output terminals of the second switching unit W2, the fourth switching unit W4 and the sixth switching unit W6 to output signals.

As shown in FIG. 23, the driving transistor T1 is electrically connected with the light-emitting element 20, and outputs a driving current to drive the light-emitting element 20 to emit light under the control of signals, such as the scanning signal SCAN, the data signal DATA, the first voltage signal ELVDD, the second voltage signal ELVSS, etc.

For example, the light-emitting element 20 is an organic light-emitting diode (OLED), and the light-emitting element 20 emits red light, green light, blue light, or white light under the drive of a corresponding pixel circuit 10. For example, one pixel includes a plurality of pixel units. One pixel can include a plurality of pixel units emitting light of different colors. For example, one pixel includes a pixel unit emitting red light, a pixel unit emitting green light and a pixel unit emitting blue light, but is not limited to this case. The number of pixel units included in one pixel and the light-emitting condition of each pixel unit can be determined as needed.

For example, as shown in FIG. 23, the gate electrode T20 of the data writing transistor T2 is connected with the gate line GL, the first electrode T21 of the data writing transistor T2 is connected with the data line DL, and the second electrode T22 of the data writing transistor T2 is connected with the first electrode T11 of the driving transistor T1.

For example, as shown in FIG. 23, the pixel circuit 10 further includes a threshold compensation transistor T3, the gate electrode T30 of the threshold compensation transistor T3 is connected with the gate line GL, the first electrode T31 of the threshold compensation transistor T3 is connected with the second electrode T12 of the driving transistor T1, and the second electrode T32 of the threshold compensation transistor T3 is connected with the gate electrode T10 of the driving transistor T1.

For example, as shown in FIG. 23, the display panel further includes a light-emitting control signal line EML, and the pixel circuit 10 further includes a first light-emitting control transistor T4 and a second light-emitting control transistor T5. The gate electrode T40 of the first light-emitting control transistor T4 is connected with the light-emitting control signal line EML, the first electrode T41 of the first light-emitting control transistor T4 is connected with the first power terminal VDD, and the second electrode T42 of the first light-emitting control transistor T4 is connected with the first electrode T11 of the driving transistor T1. The gate electrode T50 of the second light-emitting control transistor T5 is connected with the light-emitting control signal line EML, the first electrode T51 of the second light-emitting control transistor T5 is connected with the second electrode T12 of the driving transistor T1, and the second electrode T52 of the second light-emitting control transistor t5 is connected with the first electrode 201 of the light-emitting element 20.

As shown in FIG. 23, the first reset transistor T6 is connected with the gate electrode T10 of the driving transistor T1 and configured to reset the gate electrode of the driving transistor T1, and the second reset transistor T7 is connected with the first electrode 201 of the light-emitting element 20 and configured to reset the first electrode 201 of the light-emitting element 20. The first initialization signal line INT1 is connected with the gate electrode of the driving transistor T1 through the first reset transistor T6. The second initialization signal line INT2 is connected with the first electrode 201 of the light-emitting element 20 through the second reset transistor T7. For example, the first initialization signal line INT1 and the second initialization signal line INT2 are connected, so as to be input with the same initialization signal, but the embodiment is not limited to this case. In some embodiments, the first initialization signal line INT1 and the second initialization signal line INT2 can also be insulated from each other and configured to be input with signals separately.

For example, as shown in FIG. 23, the first electrode T61 of the first reset transistor T6 is connected with the first initialization signal line INT1, the second electrode T62 of the first reset transistor T6 is connected with the gate electrode T10 of the driving transistor T1, the first electrode T71 of the second reset transistor T7 is connected with the second initialization signal line INT2, and the second electrode T72 of the second reset transistor T7 is connected with the first electrode 201 of the light-emitting element 20. For example, as shown in FIG. 23, the gate electrode T60 of the first reset transistor T6 is connected with the first reset control signal line RT1, and the gate electrode T70 of the second reset transistor T7 is connected with the second reset control signal line RT2.

As shown in FIG. 23, the first power terminal VDD is configured to provide a first voltage signal ELVDD to the pixel circuit 10; the pixel circuit further includes a storage capacitor Cst, the first electrode Ca of the storage capacitor Cst is connected with the gate electrode T10 of the driving transistor T1, and the second electrode Cb of the storage capacitor Cst is connected with the first power terminal VDD.

For example, as shown in FIG. 23, the display panel further includes a second power terminal VSS, and the second power terminal VSS is connected with the second electrode 201 of the light-emitting element 20.

As shown in FIG. 23 and FIG. 24, the gate line GL of the pixel units in a same row is connected with the second reset control signal line RT2, so that the scanning signal SCAN is input to both the gate line GL and the second reset control signal line RT2, but the embodiment is not limited to this case.

FIG. 25 shows a third direction Z, the third direction Z is perpendicular to the base substrate BS, the third direction Z is perpendicular to the first direction X, and the third direction Z is perpendicular to the second direction Y.

Referring to FIG. 25, a buffer layer BL is located on the base substrate BS, an isolation layer BR is located on the buffer layer BL, the channel region, source region and drain region of a transistor are located on the isolation layer BR, a first gate insulating layer GI1 is disposed on the channel region, source region and drain region of the transistor, a first conductive pattern layer LY1 is located on the first gate insulating layer GI1, a second gate insulating layer GI2 is located on the first conductive pattern layer LY1, a second conductive pattern layer LY2 is located on the second gate insulating layer GI2, an interlayer insulating layer ILD is located on the second conductive pattern layer LY2, a third conductive pattern layer LY3 is located on the interlayer insulating layer ILD, a passivation layer PVX is located on the third conductive pattern layer LY3, a first planarization layer PLN1 is located on the passivation layer PVX, and a fourth conductive pattern layer LY4 is located on the first planarization layer PLN1.

Referring to FIG. 25, a second planarization layer PLN2 is located on the fourth conductive pattern layer LY4, the first electrode 201 of the light-emitting element 20 is located on the second planarization layer PLN2, a pixel definition layer PDL and a photo spacer PS are located on the second planarization layer PLN2, the pixel definition layer PDL has an opening OPN, and the opening OPN is configured to define the light-emitting area (light exiting region, effective light-emitting area) of the pixel unit. The photo spacer PS is configured to support a fine metal mask when forming a light-emitting functional layer 203.

For example, the opening OPN is the light exiting region of the pixel unit. The light-emitting functional layer 203 is located on the first electrode 201 of the light-emitting element 20, the second electrode 202 of the light-emitting element 20 is located on the light-emitting functional layer 203, and an encapsulation layer CPS is disposed on the light-emitting element 20. The encapsulation layer CPS includes a first encapsulation layer CPS1, a second encapsulation layer CPS2 and a third encapsulation layer CPS3. For example, the first encapsulation layer CPS1 and the third encapsulation layer CPS3 are inorganic material layers, and the second encapsulation layer CPS2 is an organic material layer. For example, the first electrode 201 is the anode of the light-emitting element 20, and the second electrode 202 is the cathode of the light-emitting element 20, but the embodiment is not limited to this case.

For example, the light-emitting element 20 includes an organic light-emitting diode. The light-emitting functional layer 203 is located between the second electrode 202 and the first electrode 201. The second electrode 202 is located on one side of the first electrode 201 away from the base substrate BS, and the light-emitting functional layer 203 at least includes a light-emitting layer, and may further include at least one of a hole transport layer, a hole injection layer, an electron transport layer and an electron injection layer.

For example, the buffer layer BL, the isolation layer BR, the first gate insulating layer GI1, the second gate insulating layer GI2, the interlayer insulating layer ILD, the passivation layer PVX, the first planarization layer PLN1 and the second planarization layer PLN2 are all insulating layers, and a via hole can be disposed in at least one of the first gate insulating layer GI1, the second gate insulating layer GI2, the interlayer insulating layer ILD, the passivation layer PVX, the first planarization layer PLN1 and the second planarization layer PLN2, so that conductive elements located at both sides of an insulating layer can be connected through the via hole.

As shown in FIG. 25, the second electrode Cb of the storage capacitor has an opening OPN, and the arrangement of the opening OPN facilitates the connection between the connection electrode CEa and the gate electrode T10 of the driving transistor T1. FIG. 25 shows the channel region T13 of the driving transistor T1, a via hole HL1 and a via hole HL2. The connection electrode CEb is connected with the second electrode T52 of the second light-emitting transistor T5 through the via hole HL1, and the connection electrode CEc is connected with the connection electrode CEb through the via hole HL2. The first electrode 201 of the light-emitting element 20 is connected with the connection electrode CEc through a via hole HL3.

Figure 26:
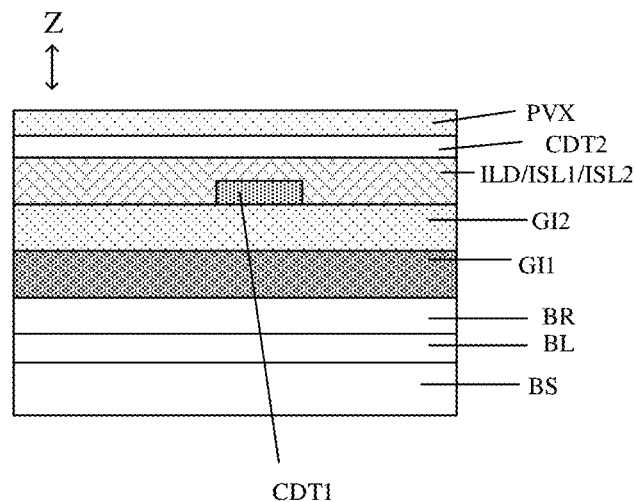
FIG. 26 is a partial cross-sectional view of a display panel before an ablation process according to an embodiment of the present disclosure.
Figure 27:
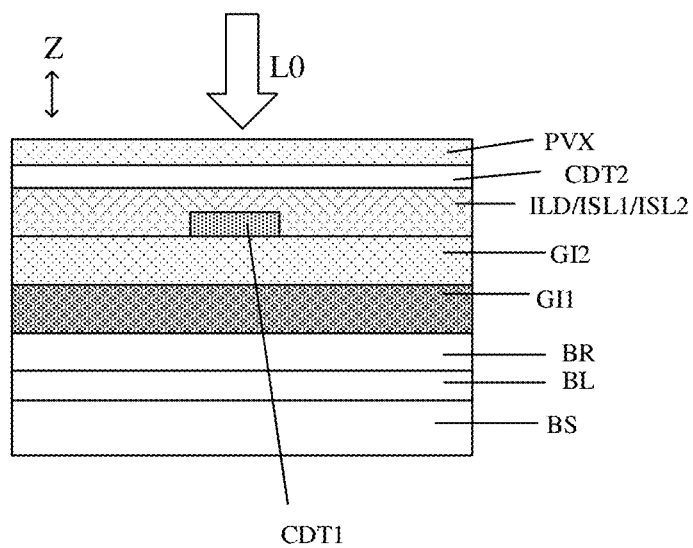
FIG. 27 is a schematic diagram of a display panel during an ablation process according to an embodiment of the present disclosure.
Figure 28:
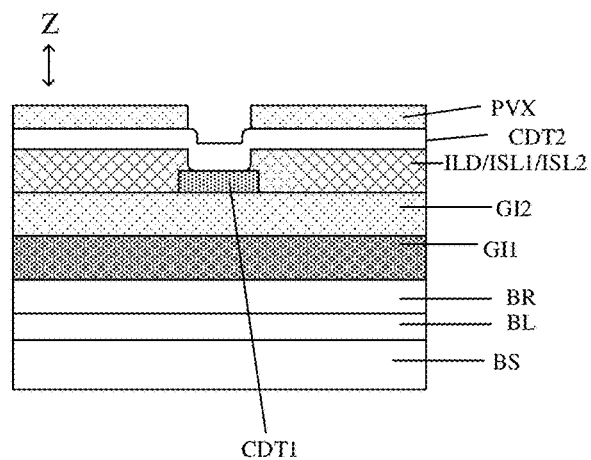
FIG. 28 is a partial cross-sectional view of a display panel after an ablation process according to an embodiment of the present disclosure.

FIG. 26 is a partial cross-sectional view of a display panel before an ablation process according to an embodiment of the present disclosure. FIG. 27 is a schematic diagram of a display panel during an ablation process according to an embodiment of the present disclosure. FIG. 28 is a partial cross-sectional view of a display panel after an ablation process according to an embodiment of the present disclosure.

As shown in FIG. 26, an interlayer insulating layer ILD is disposed between a conductive line CDT1 and a conductive line CDT2, and the conductive line CDT1 and the conductive line CDT2 are insulated from each other. For example, the conductive line CDT1 is the first repair line RL1 and the conductive line CDT2 is the data transmission line DTL; or, the conductive line CDT1 is the second repair line RL2 and the conductive line CDT2 is the data line DL.

As shown in FIG. 27, the overlapping position (the position to be repaired) between the conductive line CDT1 and the conductive line CDT2 is irradiated with laser L0.

As shown in FIG. 28, the insulating layer at the laser irradiation position is ablated, and the conductive line CDT1 and the conductive line CDT2 are in contact, so that the conductive line CDT1 and the conductive line CDT2 are connected, thus repairing the defect of breakage.

FIG. 26 to FIG. 28 are illustrated by taking the case where an interlayer insulating layer ILD is disposed between the conductive line CDT1 and the conductive line CDT2 as an example. In other embodiments, the insulating layer ISL1 or the insulating layer ISL2 between the conductive line CDT1 and the conductive line CDT2 may also be other insulating layer or several other insulating layers.

With regard to the pixel circuit, reference can be made to FIG. 4 to FIG. 10 and FIG. 23 to FIG. 25. As shown in FIG. 4, FIG. 5 and FIG. 7, a block portion BK1 is used for shielding the conductive connection portion CP1 of the first reset transistor T6, and a block portion BK2 is used for shielding the conductive connection portion CP2 of the threshold compensation transistor T3. The conductive connection portion CP1 is used for connecting the first channel and the second channel of the first reset transistor T6, and the conductive connection portion CP2 is used for connecting the first channel and the second channel of the threshold compensation transistor T3. Generally, the semiconductor pattern is doped by using the first conductive pattern layer LY1 as a mask, so that the region of the semiconductor pattern covered by the first conductive pattern layer LY1 retains semiconductor characteristics and forms an active layer, while the region of the semiconductor pattern not covered by the first conductive pattern layer LY1 is conductive to form the source region and the drain region of the thin film transistor, thereby forming an active layer pattern SCP. For example, the material of the channel includes poly-silicon, and the material of the source region, the drain region and the conductive connection portion of the transistor includes doped poly-silicon.

As shown in FIG. 10A, the gate line GL includes a first portion GL01 and a second portion GL02 located in different layers, and the first portion GL01 and the second portion GL02 are connected.

For example, the transistors in the pixel circuit of the embodiment of the present disclosure are all thin film transistors. For example, the first conductive pattern layer LY1, the second conductive pattern layer LY2, the third conductive pattern layer LY3, and the fourth conductive pattern layer LY4 are all made of metal materials. For example, the first conductive pattern layer LY1 and the second conductive pattern layer LY2 are formed of metal materials such as nickel and aluminum, etc., but are not limited thereto. For example, the third conductive pattern layer LY3 and the fourth conductive pattern layer LY4 are formed of materials such as titanium and aluminum, etc., but are not limited thereto. For example, the third conductive pattern layer LY3 and the fourth conductive pattern layer LY4 have a structure formed by three sub-layers of Ti/Al/Ti, but are not limited thereto. For example, the base substrate can be a glass substrate or a polyimide substrate, but is not limited thereto, and can be selected as needed. For example, the buffer layer BL, the isolation layer BR, the first gate insulating layer GI1, the second gate insulating layer GI2, the interlayer insulating layer ILD, the passivation layer PVX, the first planarization layer PLN1, the second planarization layer PLN2, the pixel definition layer PDL, and the photo spacer PS are all made of insulating materials. Materials of the first electrode 201 and the second electrode 202 of the light-emitting element can be selected as needed. In some embodiments, the first electrode 201 can adopt at least one of transparent conductive metal oxide and silver, but is not limited thereto. For example, the transparent conductive metal oxide includes indium tin oxide (ITO), but is not limited thereto. For example, the first electrode 201 can adopt a structure formed by three sub-layers of ITO-Ag-ITO which are laminated. In some embodiments, the second electrode 202 can be a metal with low work function, and can adopt at least one of magnesium and silver, but is not limited thereto.

A manufacturing method of a display panel provided by at least one embodiment of the present disclosure includes the following steps.

Step S1, forming a buffer layer BL and an isolation layer BR on a base substrate BS.

Step S2, forming a semiconductor pattern on the isolation layer BR.

Step S3, forming a first gate insulating layer GI1 on the semiconductor pattern.

Step S4, forming a first conductive pattern layer LY1 on the first gate insulating layer GI1.

Step S5, doping the semiconductor pattern by using the first conductive pattern layer LY1 as a mask, so that the region of the semiconductor pattern covered by the first conductive pattern layer LY1 retains semiconductor characteristics and forms an active layer, while the region of the semiconductor pattern not covered by the first conductive pattern layer LY1 is conductive to form the source region and the drain region of the thin film transistor, thereby forming an active layer pattern SCP.

Step S6, forming a second gate insulating layer GI2, after forming the active layer pattern SCP and the first conductive pattern layer LY1.

Step S7, forming a second conductive pattern layer LY2 on the second gate insulating layer GI2.

Step S8, forming an interlayer insulating layer ILD on the second conductive pattern layer LY2.

Step S9, performing a first-order via hole forming process to form a via hole in at least one of the first gate insulating layer GI1, the second gate insulating layer GI2 and the interlayer insulating layer ILD, that is, forming a via hole at the position where the via hole needs to be formed, and the number of insulating layers penetrated by the via hole is determined according to the components to be connected.

Step S10, after the first-order via hole forming process, forming a third conductive pattern layer LY3. Elements in the third conductive pattern layer LY3 can be connected with elements in the active layer pattern SCP, the first conductive pattern layer LY1 and/or the second conductive pattern layer LY2 through via holes as needed.

Step S11, forming a passivation layer PVX and a first planarization layer PLN1 on the third conductive pattern layer LY3.

Step S12, performing a second-order via hole forming process to form a via hole in the passivation layer PVX and the first planarization layer PLN1.

Step S13: after the second-order via hole forming process, forming a fourth conductive pattern layer LY4. For example, elements in the fourth conductive pattern layer LY4 are connected with elements in the third conductive pattern layer LY3 through via holes.

In the embodiment of the present disclosure, a structure in which one data line corresponds to one column of pixel units can be adopted, or a dual source structure in which two data lines correspond to one column of pixel units can be adopted. In the embodiment of the present disclosure, the display panel is not limited to an OLED display panel, and may also be a display panel of any other type, such as a liquid crystal display panel.

In the embodiment of the present disclosure, the first repair line RL11 and the first repair line RL12 can also be referred to as a third repair line RL11 and a fourth repair line RL12, respectively, and the second repair line RL21 and the second repair line RL22 can also be referred to as a fifth repair line RL21 and a sixth repair line RL22, respectively.

Figure 29:
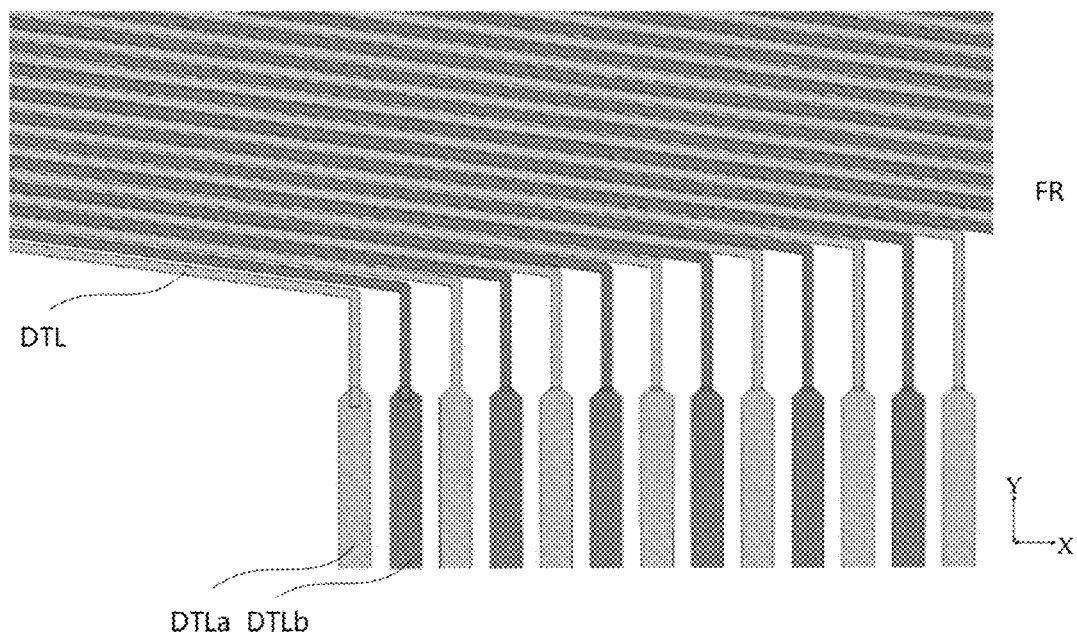
FIG. 29 is a schematic diagram of a fan-out region of a display panel provided by an embodiment of the present disclosure.

FIG. 29 is a schematic diagram of a fan-out region of a display panel provided by an embodiment of the present disclosure. In the fan-out region FR, inclined traces are arranged densely at the end away from the integrated circuit IC, while substantially parallel traces (traces extending along the second direction Y) are arranged sparsely at the end close to the integrated circuit IC. FIG. 29 shows a data transmission line DTLa and a data transmission line DTLb, the data transmission line DTLa and the data transmission line DTLb are adjacent to each other, and the data transmission line DTLa and the data transmission line DTLb are located in different layers. For example, one of the data transmission line DTLa and the data transmission line DTLb is located in the first conductive pattern layer LY1, and the other one of the data transmission line DTLa and the data transmission line DTLb is located in the second conductive pattern layer LY2.

Figure 30:
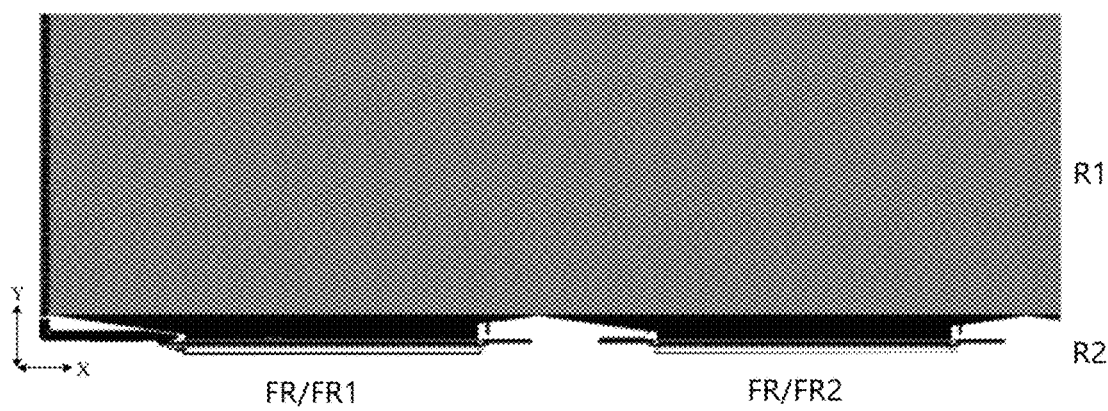
FIG. 30 is a schematic diagram of another display panel provided by an embodiment of the present disclosure.

FIG. 30 is a schematic diagram of another display panel provided by an embodiment of the present disclosure. The display panel includes a plurality of integrated circuits IC, and FIG. 30 shows two integrated circuits IC, but the number of integrated circuits IC is not limited to that shown in the figure. For example, large-sized display panels usually adopt a plurality of integrated circuits IC. Each integrated circuit IC can correspond to two repair structures, and each repair structure can repair up to two breakpoints in a corresponding region. FIG. 30 shows a first fan-out region FR1 and a second fan-out region FR2. Each fan-out region FR is correspondingly provided with one integrated circuit IC. Each fan-out region FR can correspond to two repair structures.

Figure 31:
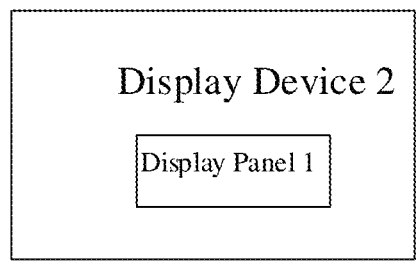
FIG. 31 is a schematic diagram of a display device provided by an embodiment of the present disclosure.

At least one embodiment of the present disclosure further provides a display device, and FIG. 31 is a schematic diagram of a display device provided by at least one embodiment of this disclosure. As shown in FIG. 31, the display device 2 includes a display panel 1, and the display panel 1 can be the display panel provided by any embodiment of the present disclosure.

For example, the display device can be a display device such as a liquid crystal display, an electronic paper, an organic light-emitting diode (OLED) display, etc., and any product or component including the display device and having display function, such as a television, a digital camera, a mobile phone, a watch, a tablet computer, a notebook computer and a navigator, etc. For example, the display device 2 can further include other components, such as a data driving circuit, a timing controller, etc., without being limited in the embodiment of the present disclosure.

It should be noted that, for the sake of clarity and conciseness, the embodiment of the present disclosure do not give all the constituent units of the display device 2. In order to realize the basic functions of the display device 2, those skilled in the art can provide and set other unillustrated structures according to specific needs, without being limited in the embodiment of the present disclosure.

The technical effects of the display device 2 provided by the above embodiment can be referred to the technical effects of the display panel provided by the embodiment of the present disclosure, which will not be repeated here.

In the embodiment of the present disclosure, elements located in the same layer can be subjected to a same patterning process on a same film layer. For example, elements located in the same layer may be located on a surface of the same element away from the base substrate.

It should be noted that for the sake of clarity, the thicknesses of layers or regions are exaggerated in the accompanying drawings for describing the embodiment of the present disclosure. It can be understood that when an element such as a layer, film, region or substrate is said to be located "on" or "under" another element, the element can be "directly" located "on" or "under" the another element, or there may exists an intermediate element there-between.

In the embodiment of the present disclosure, patterning or a patterning process may include only a photolithography process, or a photolithography process and an etching step, or may include any other process for forming a predetermined pattern, such as printing, ink-jetting and the like. The photolithography process refers to a process including film forming, exposing and developing, etc., and uses photoresist, mask plate and exposure machine to form a pattern. A corresponding patterning process can be selected according to the structure formed in the embodiment of the present disclosure.

In case of no conflict, the features in one same embodiment and in different embodiments of the present disclosure can be combined.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:
1. A display panel, comprising:
a display region;
a peripheral region surrounding the display region;
a plurality of pixel units, located in the display region and configured to display an image;
a plurality of data lines, electrically connected with the plurality of pixel units and configured to input data signals to the plurality of pixel units;
a plurality of data transmission lines, located in the peripheral region and connected with the plurality of data lines;
at least two repair structures, wherein each of the at least two repair structures comprises a first repair line and a second repair line, the first repair line is overlapped with the plurality of data transmission lines, and the second repair line is overlapped with the plurality of data lines,
the repair structure further comprises a plurality of first data multiplexers and a second data multiplexer, the second repair line comprises a plurality of second repair lines, and the plurality of data transmission lines are connected with the plurality of data lines through the plurality of first data multiplexers; the first repair line is connected with the plurality of second repair lines through the second data multiplexer; the second data multiplexer and the plurality of first data multiplexers are located at a same side of the plurality of pixel units,
the display panel further comprises an integrated circuit, wherein the integrated circuit is connected with the plurality of data transmission lines, and
the repair structure further comprises a third data multiplexer, the first repair line comprises a plurality of first repair lines, and the plurality of first repair lines are connected with the integrated circuit through the third data multiplexer.

2. The display panel according to claim 1, wherein two repair structures of the at least two repair structures are symmetrically arranged, and two first repair lines respectively belonging to the two repair structures are disconnected at a symmetry axis.

3. The display panel according to claim 2, wherein two second repair lines respectively belonging to the two repair structures are disconnected at the symmetry axis.

4. The display panel according to claim 1, wherein the second repair line is located in the peripheral region and located at one side of the display region away from the first repair line,
and/or,
in a same repair structure, the first repair line and the second repair line are located at opposite sides of the display region, respectively.

5. The display panel according to claim 1, wherein the second repair line and the second data multiplexer are located at opposite sides of the display region, respectively,
and/or,
wherein the second data multiplexer and the plurality of first data multiplexers share a same first control line and a same second control line.

6. The display panel according to claim 1, wherein in a same repair structure, the plurality of second repair lines and the first repair line are connected inside the integrated circuit.

7. The display panel according to claim 1, wherein the plurality of first repair lines are located in the peripheral region and located at one side of the third data multiplexer away from the display region,
and/or, wherein the second data multiplexer, the third data multiplexer, and the plurality of first data multiplexers are sequentially arranged in a first direction, and/or, wherein the third data multiplexer and the plurality of first data multiplexers share a same first control line and a same second control line.

8. The display panel according to claim 1, wherein in one of two repair structures that are symmetrically arranged, the plurality of second repair lines comprise two second repair lines, the plurality of first repair lines comprise two first repair lines, the first data multiplexer comprises a first switching unit and a second switching unit, the second data multiplexer comprises a third switching unit and a fourth switching unit, the third data multiplexer comprises a fifth switching unit and a sixth switching unit, and the third switching unit, the fourth switching unit, the fifth switching unit, the sixth switching unit, the first switching unit and the second switching unit are sequentially arranged.

9. The display panel according to claim 8, wherein the two first repair lines are respectively connected with the third data multiplexer through a first connection line, one of the two first repair lines is connected with a first signal line through the fifth switching unit, the other one of the two first repair lines is connected with a second signal line through the sixth switching unit, and the second signal line is overlapped with the first connection line.

10. The display panel according to claim 9, wherein the two second repair lines are connected with a second connection line through the second data multiplexer, and the second connection line, the first signal line and the second signal line are sequentially arranged, and/or, wherein the first repair line and the first connection line connected thereto are formed as an integral structure.

11. The display panel according to claim 10, wherein the second connection line, the first signal line and the second signal line are connected inside the integrated circuit.

12. The display panel according to claim 1, wherein the first repair line extends along a first direction, and a size, in the first direction, of a portion of the data transmission line overlapped with the first repair line is greater than a size, in the first direction, of a portion of the data transmission line not overlapped with the first repair line, and/or, wherein a portion of the data line overlapped with the second repair line is located in the peripheral region and located at one side of the display region away from the first repair line.

13. The display panel according to claim 1, wherein the data transmission line has a plurality of first protruding portions, the plurality of first protruding portions are overlapped with the plurality of first repair lines, respectively, and the plurality of first protruding portions are located at a same side of the data transmission line.

14. The display panel according to claim 1, wherein the data line has a second protruding portion, and two second protruding portions of two adjacent data lines are arranged, in a staggered manner, between the two adjacent data lines, or the two second protruding portions of the two adjacent data lines are arranged back to back.

15. The display panel according to claim 1, wherein an insulating layer is disposed between the first repair line and the plurality of data transmission lines, and the insulating layer is disposed between the second repair line and the plurality of data lines.

16. The display panel according to claim 12, wherein the portion of the data line overlapped with the second repair line and a portion of the data line located in the display region are located in different layers.

17. A display device, comprising the display panel according to claim 1.

* * * * *